(12) United States Patent
Ohba

(10) Patent No.: US 12,002,781 B2
(45) Date of Patent: Jun. 4, 2024

(54) SEMICONDUCTOR DEVICE AND METHOD FOR MANUFACTURING SAME

(71) Applicant: TOKYO INSTITUTE OF TECHNOLOGY, Tokyo (JP)

(72) Inventor: Takayuki Ohba, Tokyo (JP)

(73) Assignee: TOKYO INSTITUTE OF TECHNOLOGY, Tokyo (JP)

( * ) Notice: Subject to any disclaimer, the term of this patent is extended or adjusted under 35 U.S.C. 154(b) by 406 days.

(21) Appl. No.: 17/645,131

(22) Filed: Dec. 20, 2021

(65) Prior Publication Data
US 2022/0208710 A1 Jun. 30, 2022

(30) Foreign Application Priority Data
Dec. 25, 2020 (JP) ................................ 2020-217061

(51) Int. Cl.
*H01L 23/00* (2006.01)
*H01L 25/00* (2006.01)
*H01L 25/065* (2023.01)

(52) U.S. Cl.
CPC .............. *H01L 24/19* (2013.01); *H01L 24/08* (2013.01); *H01L 24/20* (2013.01);
(Continued)

(58) Field of Classification Search
CPC ......... H01L 24/19; H01L 24/08; H01L 24/20; H01L 25/0652; H01L 25/0657;
(Continued)

(56) References Cited

U.S. PATENT DOCUMENTS

| 2005/0162946 | A1 | 7/2005 | Koide |
| 2009/0014891 | A1* | 1/2009 | Chang .................... H01L 24/24 |
| | | | 257/E23.068 |

(Continued)

FOREIGN PATENT DOCUMENTS

| JP | 2005-209814 | 8/2005 |
| TW | 201340292 | 10/2013 |
| TW | 201801279 | 1/2018 |

OTHER PUBLICATIONS

Office Action dated Jan. 10, 2023 with respect to the corresponding Taiwanese patent application No. 110148271.
(Continued)

*Primary Examiner* — Fernando L Toledo
*Assistant Examiner* — Neil R Prasad
(74) *Attorney, Agent, or Firm* — IPUSA, PLLC

(57) ABSTRACT

A first substrate having a first face and a second face is prepared. The first face has a plurality of product regions defined thereon. An electrode pad forming side of each of a semiconductor chip stack and a semiconductor chip is attached to each corresponding product region of the plurality of product regions. The second face of the first substrate is thinned. A first inorganic insulating layer is formed on the second face. A first vertical interconnection penetrates the first inorganic insulating layer and the first substrate and is electrically connected to an electrode pad of the semiconductor chip stack. A second vertical interconnection penetrates the first inorganic insulating layer and the first substrate and is electrically connected to an electrode pad of the semiconductor chip. A first horizontal interconnection electrically connects a part of the first vertical interconnection to a part of the second vertical interconnection.

13 Claims, 18 Drawing Sheets

(52) U.S. Cl.
CPC ...... *H01L 25/0652* (2013.01); *H01L 25/0657* (2013.01); *H01L 25/50* (2013.01); *H01L 2224/08147* (2013.01); *H01L 2224/2101* (2013.01); *H01L 2224/211* (2013.01); *H01L 2225/06541* (2013.01)

(58) Field of Classification Search
CPC ........... H01L 25/50; H01L 2224/08147; H01L 2224/2101; H01L 2224/211; H01L 2225/06541
See application file for complete search history.

(56) References Cited

U.S. PATENT DOCUMENTS

| | | |
|---|---|---|
| 2011/0068444 A1 | 3/2011 | Chi et al. |
| 2013/0210198 A1 | 8/2013 | Lin |
| 2013/0249042 A1 | 9/2013 | Shen et al. |
| 2016/0013148 A1 | 1/2016 | Lin et al. |
| 2017/0373037 A1 | 12/2017 | Yu et al. |
| 2022/0139878 A1* | 5/2022 | Ogawa .................... H01L 25/50 257/213 |
| 2024/0030151 A1* | 1/2024 | Wu ......................... H01L 25/50 |

OTHER PUBLICATIONS

Office Action dated Jan. 10, 2024 issued with respect to the corresponding Taiwanese patent application No. 110148271.

* cited by examiner

SEMICONDUCTOR DEVICE AND METHOD FOR MANUFACTURING SAME

CROSS-REFERENCE TO RELATED APPLICATION

The present application is based on and claims priority to Japanese Priority Application No. 2020-217061 filed on Dec. 25, 2020, the entire contents of which are hereby incorporated herein by reference.

BACKGROUND OF THE INVENTION

1. Field of the Invention

The present disclosure relates to a semiconductor device and a method for manufacturing the same.

2. Description of the Related Art

In recent years, semiconductor applied products have been rapidly reduced in size, thickness, and weight for various mobile device applications such as smartphones. Along with this, there is demand for smaller sizes and higher densities for semiconductor devices mounted on semiconductor applied products. Therefore, semiconductor chip stacks including a plurality of stacked semiconductor chips have been proposed. The semiconductor chips to be stacked are, for example, memory chips, as described in Japanese Patent Application Laid-Open No. 2005-209814.

The semiconductor chip stack as described above is, for example, mounted on an interposer, and is electrically connected to other semiconductor chips mounted, for example, on the same interposer, via an interconnection provided in the interposer. However, because the insulating layer of the interconnection provided in the interposer is made of an organic material, and a leakage current increases when an interconnection pitch is narrowed, it is difficult to increase the density of the interconnection.

In addition, because a bump (such as a solder bump) has been used for connecting the semiconductor chip stack and the semiconductor chip to the interposer, the contact resistance of the bump and the resistance of the bump itself have increased the resistance of the entire interconnection, and the failure of the bump has also reduced the reliability of the interconnection.

SUMMARY OF THE INVENTION

The present disclosure has been made in view of the above points, and is intended to increase density and reliability of an interconnection connecting a semiconductor chip stack to a semiconductor chip.

According to one embodiment of the present disclosure, there is provided a method for manufacturing a semiconductor device. In the method, a first substrate having a first face and a second face disposed is prepared. The first face has a plurality of product regions defined thereon. An electrode pad forming side of each of a semiconductor chip stack and a semiconductor chip is attached directly or indirectly to each corresponding product region of the plurality of product regions of the first face of the first substrate. The second face of the first substrate opposite the first face is thinned. A first inorganic insulating layer is formed on the second face of the first substrate. A first vertical interconnection penetrating through the first inorganic insulating layer and the first substrate and directly and electrically connected to an electrode pad of the semiconductor chip stack is formed, and a second vertical interconnection penetrating through the first inorganic insulating layer and the first substrate and directly and electrically connected to an electrode pad of the semiconductor chip is formed. A first horizontal interconnection directly and electrically connecting a part of the first vertical interconnection to a part of the second vertical interconnection is formed on a face of the inorganic insulating layer opposite the first substrate.

DETAILED DESCRIPTION OF THE PREFERRED EMBODIMENTS

Figure 1:
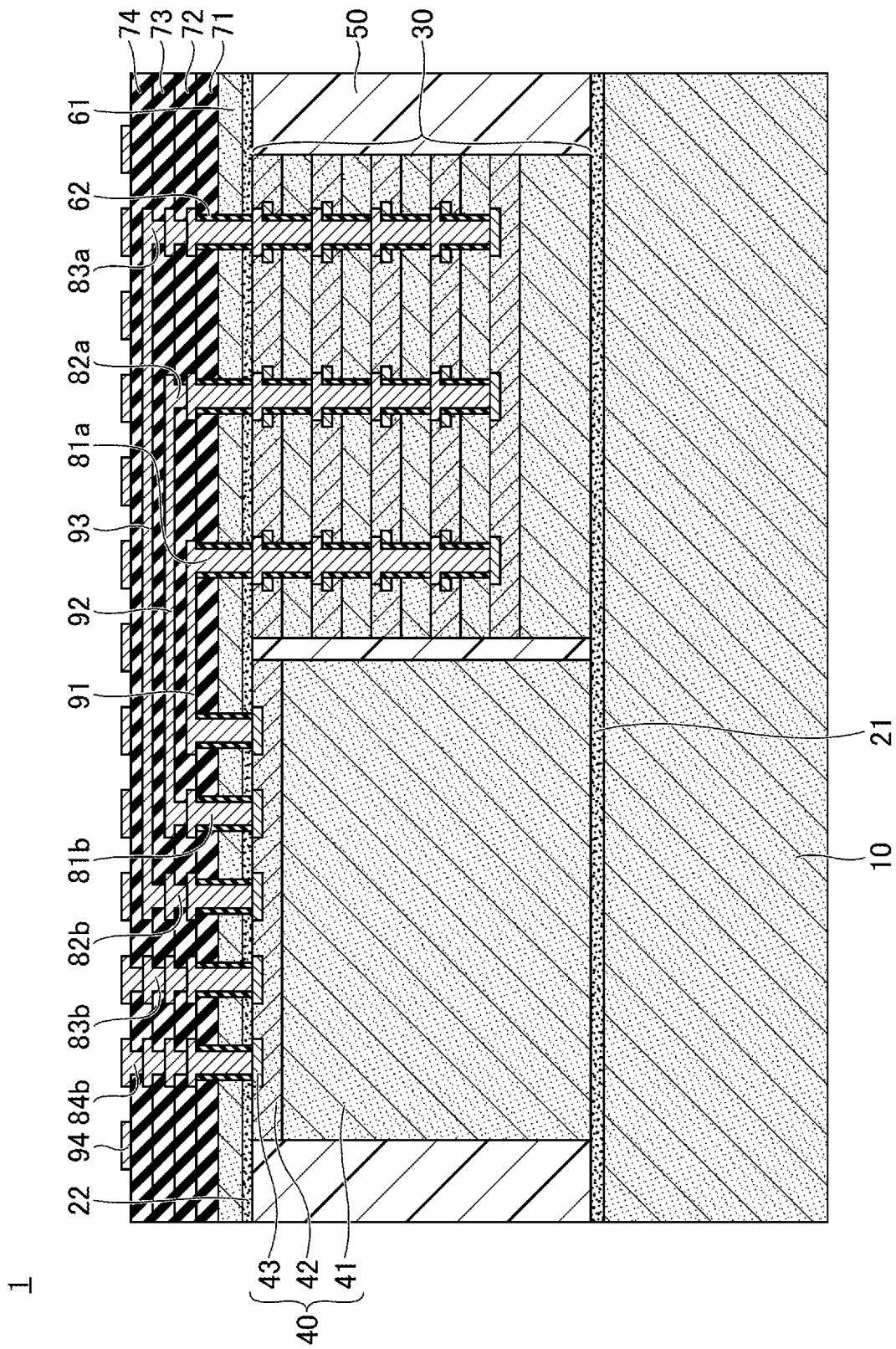
FIG. 1 is a cross-sectional view illustrating a semiconductor device according to an embodiment of the present disclosure.

Hereinafter, an embodiment for carrying out the disclosure with reference to the drawings will be described. In each drawing, the same components are indicated by the same reference numerals and overlapping descriptions may be omitted.

First Embodiment

[Semiconductor Device Structure]

FIG. 1 is a cross-sectional view illustrating a semiconductor device according to a first embodiment. Referring to FIG. 1, the semiconductor device 1 according to the first embodiment includes a substrate 10, a semiconductor chip stack 30, a semiconductor chip 40, a substrate 61, an inorganic insulating layer 71 and the like, a vertical interconnection 81a and the like, and a horizontal interconnection layer 91 and the like.

In the present application, a plan view means a view of an object as seen in a direction normal to one face of the substrate 61, and a planar shape means a shape of an object as seen in a direction normal to one face of the substrate 61.

The semiconductor chip stack 30 and the semiconductor chip 40 are attached to one face (bottom face in FIG. 1) of the substrate 61, while facing each electrode pad forming side toward the substrate 61. The substrate 61 is, for example, silicon, but may be made of germanium, sapphire, glass, or the like. The thickness of the substrate 61 may be, for example, about 1 µm to about 10 µm. The distance between facing lateral faces of the semiconductor chip stack 30 and the semiconductor chip 40 can be made, for example, about 10 µm to about 100 µm.

The electrode pad forming side of each of the semiconductor chip stack 30 and the semiconductor chip 40 can be attached to one face of the substrate 61, for example, via an adhesive layer 22. For example, a thermosetting insulating resin (for example, divinylsiloxane-bis-benzocyclobutene: DVS-BCB) having the main composition of benzocyclobutene can be used as a material of the adhesive layer 22. The adhesive layer 22 may be made of a thermosetting insulating resin including an epoxy-based resin, an acrylic-based resin, and a polyimide-based resin as a main composition, or an insulating composite material with an added solid fine powder, such as silica. A material containing silicon, such as siloxane, may be also used as a material of the adhesive layer 22. The thickness of the adhesive layer 22 may be, for example, about 1 µm to about 5 µm. A material containing a hydroxyl group may be used as the material of the adhesive layer 22. In this case, the thickness of the adhesive layer 22 may be, for example, about 1 nm to about 10 nm.

The substrate 10 is fixed to the back side of the semiconductor chip stack 30 and semiconductor chip 40 opposite the electrode pad forming side. The substrate 10 is made of, for example, silicon, but may also be made of metals such as germanium, sapphire, glass, copper, and the like. The thickness of the substrate 10 may be any thickness.

The back side of each of the semiconductor chip stack 30 and semiconductor chip 40 can be attached to the substrate 10, for example, via an adhesive layer 21. For example, a material similar to the adhesive layer 22 may be used as the material of the adhesive layer 21. However, the adhesive layer 21 and the adhesive layer 22 may be made of different materials. The thickness of the adhesive layer 21 may be, for example, about 1 µm to about 5 µm. The semiconductor device 1 does not have to remove the substrate 10 and the adhesive layer 21.

On one face of the substrate 61, a resin layer 50 that coats lateral faces of both the semiconductor chip stack 30 and the semiconductor chip 40 is provided. The resin layer 50 is disposed in a space between faces of the substrate 61 and the substrate 10 facing each other. As the material of the resin layer 50, for example, a thermosetting insulating resin including benzocyclobutene (BCB) as a main composition can be used. The resin layer 50 may be made of a thermosetting insulating resin including an epoxy-based resin, an acrylic resin, and a polyimide-based resin as a main composition, or an insulating composite material with an added solid fine powder such as silica.

An inorganic insulating layer 71 is provided on the other side (top face in FIG. 1) opposite one face of the substrate 61. Materials for the inorganic insulating layer 71 can include, for example, $SiO_2$, $SiON$, $Si_3N_4$, and porous materials. The thickness of the inorganic insulating layer 71 may be, for example, about 0.1 µm to about 0.5 µm. The inorganic insulating layer 71 may be made thinner as long as the insulating property can be secured. Because the deformation of the semiconductor device 1 is proportional to the film forming temperature and the thickness of the inorganic insulating layer 71, the inorganic insulating layer 71 preferably has a minimum thickness that can obtain insulation resistance, specifically, about 100 nm, in order to reduce the deformation of the semiconductor device 1. The same applies to inorganic insulating layers 72 to 74. By making the inorganic insulating layers 71 to 74 as thin as 100 nm, it is possible to contribute to the overall thinning of the semiconductor device 1.

A vertical interconnection 81a is provided that penetrates through the inorganic insulating layer 71 and the substrate 61 and that directly and electrically connects to the through-electrode 37 (see FIG. 2 which is described further below) of the semiconductor chip $30_5$ of the semiconductor chip stack 30. A vertical interconnection 81b is also provided that penetrates through the inorganic insulating layer 71 and the substrate 61 and that directly and electrically connects to the electrode pad 43 of the semiconductor chip 40. An insulating layer 62 is provided between the vertical interconnections 81a and 81b, and the inorganic insulating layer 71 and substrate 61. For example, $SiO_2$, $SiON$, $Si_3N_4$, or the like may be used as the material of the insulating layer 62. The thickness of the insulating layer 62 may be, for example, about 0.05 µm to about 0.5 µm. If the substrate 61 is electrically insulative, the insulating layer 62 may be eliminated.

In a plan view, the planar shape of the vertical interconnections 81a and 81b may be, for example, circular or polygonal. When the planar shape of the vertical interconnections 81a and 81b is circular, the diameter of the vertical interconnections 81a and 81b may be, for example, about 0.5 µm to about 5 µm. The vertical interconnection means an interconnection is provided inside the organic layer and the substrate and is approximately perpendicular to the surface of the inorganic insulating layer and the substrate, but does not mean that the interconnection is exactly perpendicular to the surface of the inorganic insulating layer or the substrate.

A horizontal interconnection layer 91 is provided on the face of the inorganic insulating layer 71 (the top face in FIG. 1) opposite the substrate 61. The horizontal interconnection layer 91 includes a horizontal interconnection that directly and electrically connects the vertical interconnection 81a to the vertical interconnection 81b, and an electrode pad that is directly and electrically connected only to the vertical interconnection 81*a* or only to the vertical interconnection 81*b*. As described below, the vertical interconnection 81*a*, the vertical interconnection 81*b*, and the horizontal interconnection layer 91 may be integrally formed in the same process or may be separately formed.

The materials of the vertical interconnection 81*a* and 81*b* and the horizontal interconnection layer 91 are, for example, copper. The vertical interconnections 81*a* and 81*b* and the horizontal interconnection layer 91 may have a structure including a plurality of stacked metals. Specifically, for example, the vertical interconnections 81*a* and 81*b* and the horizontal interconnection layer 91 may be a stack and the like formed by stacking an Au layer, an Al layer, a Cu layer, and the like on a Ti layer or a TiN layer. The vertical interconnections 81*a* and 81*b* and the horizontal interconnection layer 91 may be a stack formed by stacking an Au layer on a Ni layer, a stack formed by sequentially stacking a Pd layer and an Au layer on a Ni layer, a stack or an interconnection layer having a damascene structure formed by using a layer having a high melting point metal, such as Co, Ta, Ti, TiN, and the like, instead of Ni, and stacking a Cu layer or an Al layer on the same layer.

In the horizontal interconnection layer 91, the thickness of the horizontal interconnection and the electrode pad may be, for example, about 0.5 µm to about 5 µm. In the horizontal interconnection layer 91, the line/space of the horizontal interconnections may be, for example, 5 µm/1 µm, 3 µm/0.5 µm, or 1 µm/0.5 µm. In the horizontal interconnection layer 91, the diameter of the electrode pad can be larger than the diameter of the vertical interconnections 81*a* and 81*b*, for example, by about 0.5 µm to about 2 µm, or, equal to the diameter of the vertical interconnections 81*a* and 81*b*. The pitch of the electrode pads can be the same as, for example, the pitch of the horizontal interconnections. When the line width of the horizontal interconnection is 3 µm or less, the electrode pad size can be the same as the line width of the horizontal interconnection.

The horizontal interconnection means an interconnection provided approximately parallel to the surface of the inorganic insulating layer or the substrate on the surface of or inside the inorganic insulating layer or the substrate, but does not mean that the interconnection is exactly parallel to the surface of the inorganic insulating layer or the substrate.

A face of the inorganic insulating layer 71 opposite the substrate 61 includes an inorganic insulating layer 72 that coats the horizontal interconnection layer 91. The material and the thickness of the inorganic insulating layer 72 may be the same as, for example, the inorganic insulating layer 71. A vertical interconnection 82*a* is provided that penetrates through the inorganic insulating layer 72 and that is directly and electrically connected to the electrode pad of the horizontal interconnection layer 91. A vertical interconnection 82*b* is provided that penetrates through the inorganic insulating layer 72 and is directly and electrically connected to the electrode pad of the horizontal interconnection layer 91. In addition, a horizontal interconnection layer 92 is provided on the surface of the inorganic insulating layer 72 opposite the inorganic insulating layer 71 (the top face in FIG. 1). The horizontal interconnection layer 92 includes a horizontal interconnection that directly and electrically connects the vertical interconnection 82*a* to the vertical interconnection 82*b*, and an electrode pad that is directly and electrically connected only to the vertical interconnection 82*a* or 82*b*.

The vertical interconnection 82*a*, the vertical interconnection 82*b*, and the horizontal interconnection layer 92 may be integrally formed in the same process or may be separately formed as described below. The material of the vertical interconnections 82*a* and 82*b* and the horizontal interconnection layer 92, the thickness of the horizontal interconnection and the electrode pad in the horizontal interconnection layer 92 and the line/space of the horizontal interconnections, and the diameter and the pitch of the electrode pads in the horizontal interconnection layer 92 can be the same as, for example, the case of the vertical interconnection 81*a*, the vertical interconnection 81*b*, and the horizontal interconnection layer 91.

A surface of the inorganic insulating layer 72 opposite the inorganic insulating layer 71 includes an inorganic insulating layer 73 that coats the horizontal interconnection layer 92. The material and the thickness of the inorganic insulating layer 73 may be the same as, for example, the inorganic insulating layer 71. A vertical interconnection 83*a* is provided that penetrates through the inorganic insulating layer 73 and that is directly and electrically connected to the electrode pad of the horizontal interconnection layer 92. A vertical interconnection 83*b* is provided that penetrates through the inorganic insulating layer 73 and that is directly and electrically connected to the electrode pad of the horizontal interconnection layer 92. In addition, a horizontal interconnection layer 93 is provided on the face of the inorganic insulating layer 73 opposite the inorganic insulating layer 72 (the top surface in FIG. 1). The horizontal interconnection layer 93 includes a horizontal interconnection that directly and electrically connects the vertical interconnection 83*a* to the vertical interconnection 83*b*, and an electrode pad that is directly and electrically connected only to the vertical interconnection 83*b*.

The vertical interconnection 83*a*, the vertical interconnection 83*b*, and the horizontal interconnection layer 93 may be integrally formed in the same process or may be separately formed as described later. The material of the vertical interconnection 83*a* and 83*b* and the horizontal interconnection layer 93, the thickness of the horizontal interconnection and the electrode pad in the horizontal interconnection layer 93 and the line/space of the horizontal interconnections, and the diameter and the pitch of the electrode pads in the horizontal interconnection layer 93 can be the same as, for example, the case of the vertical interconnection 81*a*, the vertical interconnection 81*b*, and the horizontal interconnection layer 91.

A surface of the inorganic insulating layer 73 opposite the inorganic insulating layer 72 includes an inorganic insulating layer 74 that coats the horizontal interconnection layer 93. The material and thickness of the inorganic insulating layer 74 may be the same as, for example, the inorganic insulating layer 71. A vertical interconnection 84*b* is also provided that penetrates through the inorganic insulating layer 74 and that is directly and electrically connected to the electrode pad of the horizontal interconnection layer 93. In addition, an electrode pad 94 is provided on the face of the inorganic insulating layer 74 opposite the inorganic insulating layer 73 (the top face in FIG. 1), and is directly and electrically connected to the vertical interconnection 84*b*. The electrode pad 94 is an external connection terminal used to electrically connect the semiconductor device 1 to other substrates, other semiconductor devices, or the like. A horizontal interconnection may be provided on the face of the inorganic insulating layer 74 opposite the inorganic insulating layer 73.

The vertical interconnection 84*b* and the electrode pad 94 may be integrally formed in the same process or may be separately formed as described below. The material of the vertical interconnection 84*b* and the electrode pad 94, the diameter and the pitch of the electrode pads 94 can be the same as, for example, the electrode pads of the vertical interconnection 81b and horizontal interconnection layer 91.

Figure 2:
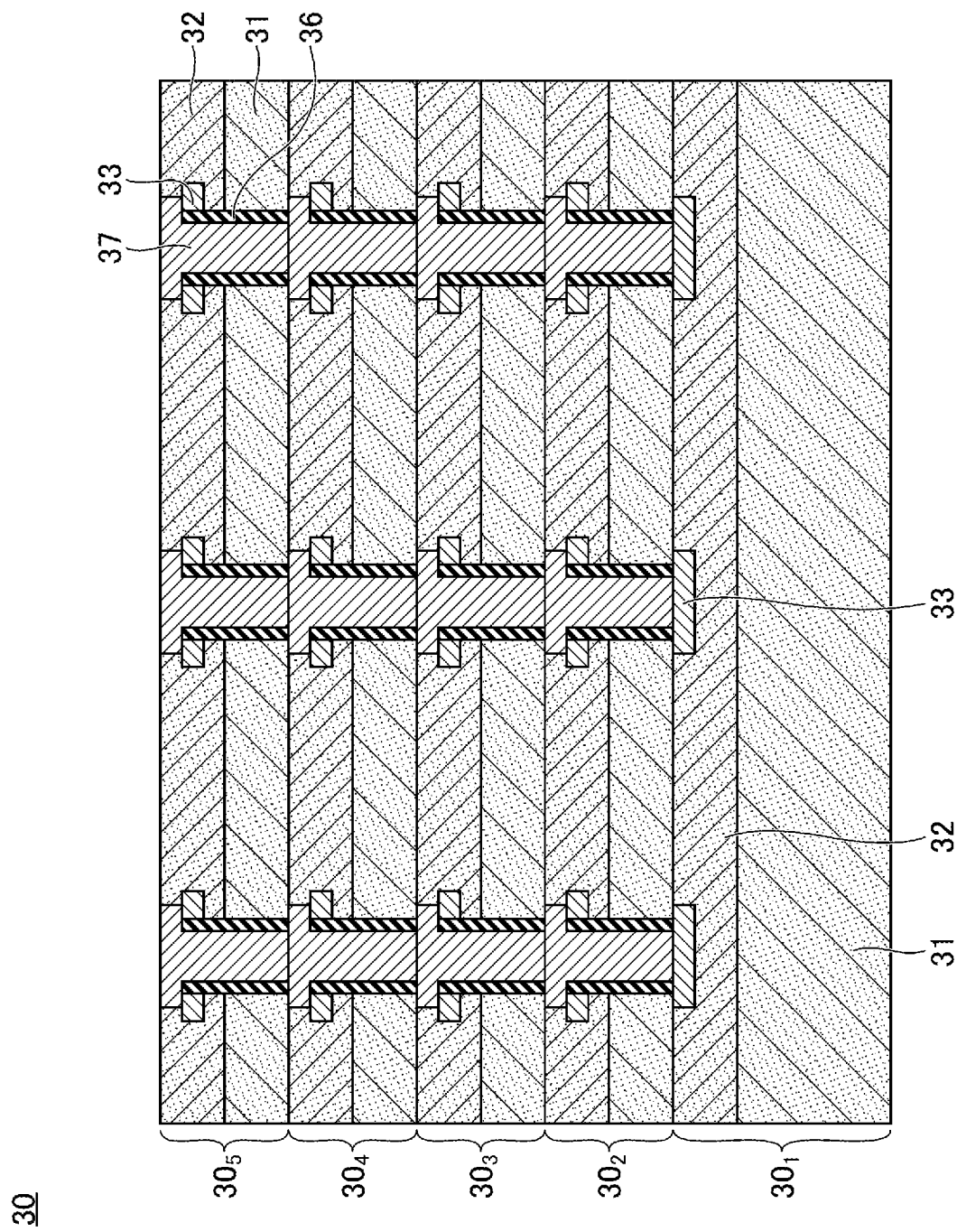
FIG. 2 is a partially enlarged cross-sectional view illustrating only a semiconductor chip stack of FIG. 1.

FIG. 2 is a partially enlarged cross-sectional view illustrating only a semiconductor chip stack of FIG. 1. Referring to FIGS. 1 and 2, the structure of the semiconductor chip stack 30 and the semiconductor chip 40 will be described.

The semiconductor chip stack 30 has a structure formed by sequentially stacking semiconductor chips $30_1$, $30_2$, $30_3$, $30_4$, and $30_5$ in the same direction on an electrode pad forming side, and allowing different layers of the semiconductor chips to communicate a signal to each other and to supply power through the connection by a through-electrode 37. The semiconductor chip stack 30 may be manufactured by wafer-on-wafer techniques.

The semiconductor chip $30_1$ has a body 31, a semiconductor integrated circuit 32, and electrode pads 33. Each of the semiconductor chips $30_2$, $30_3$, $30_4$, and $30_5$ also has a body 31, a semiconductor integrated circuit 32, an electrode pad 33, an insulating layer 36, and a through-electrode 37. The thicknesses of each of the semiconductor chips $30_2$, $30_3$, $30_4$, and $30_5$ may be, for example, about 5 μm to about 15 μm. The thickness of the semiconductor chip $30_1$ can be appropriately determined.

In semiconductor chips $30_1$ to $30_5$, the body 31 is comprised of, for example, silicon, gallium nitride, silicon carbide, and the like. The semiconductor integrated circuit 32 includes a diffusion layer (not illustrated), an insulating layer (not illustrated), a via hole (not illustrated), and an interconnection layer (not illustrated) formed in silicon, gallium nitride, silicon carbide, and the like, and is provided on one side of the body 31.

The electrode pad 33 is disposed on the top side of semiconductor integrated circuit 32 via an insulating film (such as a silicon oxide film) that is not illustrated. The electrode pad 33 is electrically connected to an interconnection layer (not illustrated) provided in the semiconductor integrated circuit 32. The planar shape of the electrode pad 33 may be, for example, rectangular or circular. When the planar shape of the electrode pad 33 is circular, the diameter of the electrode pad 33 may be, for example, about 5 μm to about 10 μm. The pitch of electrode pads 33 can be the same as, for example, the pitch of the horizontal interconnections of the horizontal interconnection layer 91.

For example, the electrode pad 33 may be a stack of layers of Au, Al, Cu, or the like on a TiN layer or a TiN layer. As the electrode pad 33, a stacked layer formed by stacking an Au layer on a Ni layer, a stacked layer formed by sequentially stacking a Pd layer and an Au layer on the Ni layer, and a layer or an interconnection having a damascene structure formed by using a high melting point metal such as Co, Ta, Ti, and TiN instead of Ni, and stacking a Cu layer or an Al layer on the same layer may be used.

In semiconductor chips $30_2$ to $30_3$, an insulating layer that provides a barrier layer may be provided on the back face of the body 31. In this case, for example, $SiO_2$, SiON, $Si_3N_4$, or the like may be used as the material of the insulating layer. The thickness of the insulating layer may be, for example, about 0.05 μm to about 0.5 μm. In the semiconductor chips $30_1$ to $30_3$, by forming an insulating layer (barrier layer) on the back face of the body 31, the risk of contamination of the semiconductor chip by metal impurities from the back face can be reduced, and when the semiconductor chip is disposed in the lower layer, the semiconductor chip can be isolated from the semiconductor chip of the lower layer.

The upper and lower adjacent semiconductor chips are joined directly without, for example, an adhesive layer or the like, but may be joined through an adhesive layer or the like as necessary (for example, where the surface of the semiconductor integrated circuit 32 is not flat). Each semiconductor chip except for the lowest layer has a via hole that penetrates through each semiconductor chip except for the lowest layer and exposes the upper face of the electrode pad 33 of the semiconductor chip $30_1$ that becomes a base, and an insulating layer 36 is provided on the inner wall (the side wall) of the via hole. For example, $SiO_2$, SiON, $Si_3N_4$, or the like may be used as the material of the insulating layer 36. The thickness of the insulating layer 36 may be, for example, about 0.05 μm to about 0.5 μm. The via hole is filled with the through-electrode 37 so as to contact the insulating layer 36. In addition, when an insulating layer is previously disposed in the body 31 and the insulating layer is greater than the diameter of the through-electrode 37, the insulating layer 36 may not be used.

The planar shape of the through-electrode 37 located within the insulating layer 36 may be, for example, circular or polygonal. When the planar shape of the through-electrode 37 located within the insulating layer 36 is circular, the diameter may be, for example, about 0.5 μm to about 5 μm. The planar shape of the through-electrode 37 located on the electrode pad 33 may be, for example, circular or polygonal. When the planar shape of the through-electrode 37 located on the electrode pad 33 is circular, its diameter may be as great as, for example, the diameter of the through-electrode 37 located within the insulating layer 36, or may be greater than the diameter of the through-electrode 37 located within the insulating layer 36 by 0.5 μm to 2 μm. The pitch of the through-electrodes 37 can be the same as, for example, the pitch of the horizontal interconnections of the horizontal interconnection layer 91.

The through-electrode 37 is, for example, copper. The through-electrode 37 may have a structure including a plurality of stacked metals. Specifically, for example, the through-electrode 37 may be a stack formed by stacking an Au layer, an Al layer, a Cu layer, and the like on a Ti layer or a TiN layer. As the through-electrode 37, a stack formed by stacking a layer of Au on a Ni layer, a stack formed by sequentially stacking Pd and Au layers on the Ni layer, and a layer or an interconnection having a damascene structure formed by using a high melting point metal such as Co, Ta, Ti, and TiN instead of Ni, and stacking a Cu layer or an Al layer on the same layer may be used.

In this manner, the electrode pads 33 of the respective semiconductor chips are formed on the top face of the electrode pad 33 and are directly and electrically connected to each other via the through-electrodes 37 formed through the insulating layer 36 in the via holes. It should be noted that the electrode pads 33 and the portions formed on the top face of the electrode pads 33 of the through-electrodes 37 may be referred to simply as electrode pads. Also, the electrode pads 33 are connected to transistors included in the semiconductor integrated circuit 32, and it may be possible to be installed without conducting electricity to the transistors and the upper and lower substrates, in particular, when it is preferable that the density of the through-electrodes 37 be uniform for processing of the through-electrodes 37. That is, there may be isolated electrode pads 33 and through-electrodes 37 that are not electrically connected. The presence of isolated electrode pads 33 and through-electrodes 37 can improve heat dissipation.

In semiconductor chips $30_1$ to $30_5$, whether electrode pads 33 are formed can be optionally determined according to the specification. This allows the through-electrode 37 to be connected only to the desired semiconductor chip in the stacked semiconductor chips. For example, the same signal can be passed through the third-layer semiconductor chip to provide the same signal to the fourth-layer semiconductor chip or the second-layer semiconductor chip, or different signals can be provided to the semiconductor chip of each layer.

The semiconductor chips $30_1$ to $30_5$ may have the same function or may have different functions. For example, all the semiconductor chips $30_1$ to $30_5$ may be memory chips. Alternatively, the semiconductor chips $30_1$ to $30_4$ may be memory chips, and semiconductor chip $30_5$ may be a logic chip. The semiconductor chips $30_1$ to $30_3$ may be memory chips, the semiconductor chip $30_4$ may be a logic chip, and the semiconductor chip $30_5$ may be a controller chip.

Also, in the semiconductor chip stack 30, five semiconductor chips may be stacked, but not limited thereto, and any number of semiconductor chips may be stacked.

Returning to FIG. 1, the semiconductor chip 40 includes a body 41, a semiconductor integrated circuit 42, and an electrode pad 43. The materials of the body 41 of the semiconductor chip 40, the semiconductor integrated circuit 42, the electrode pads 43, and the like may be the same as, for example, those of the body 31 of the semiconductor chips $30_1$ to $30_5$, the semiconductor integrated circuit 32, and the electrode pads 33. The semiconductor chip 40 may be, for example, a logic chip.

[Semiconductor Device Manufacturing Process]

Next, a manufacturing process of the semiconductor device according to the first embodiment will be described. FIGS. 3 to 14 are diagrams illustrating a manufacturing process of a semiconductor device according to a first embodiment.

Figure 3:
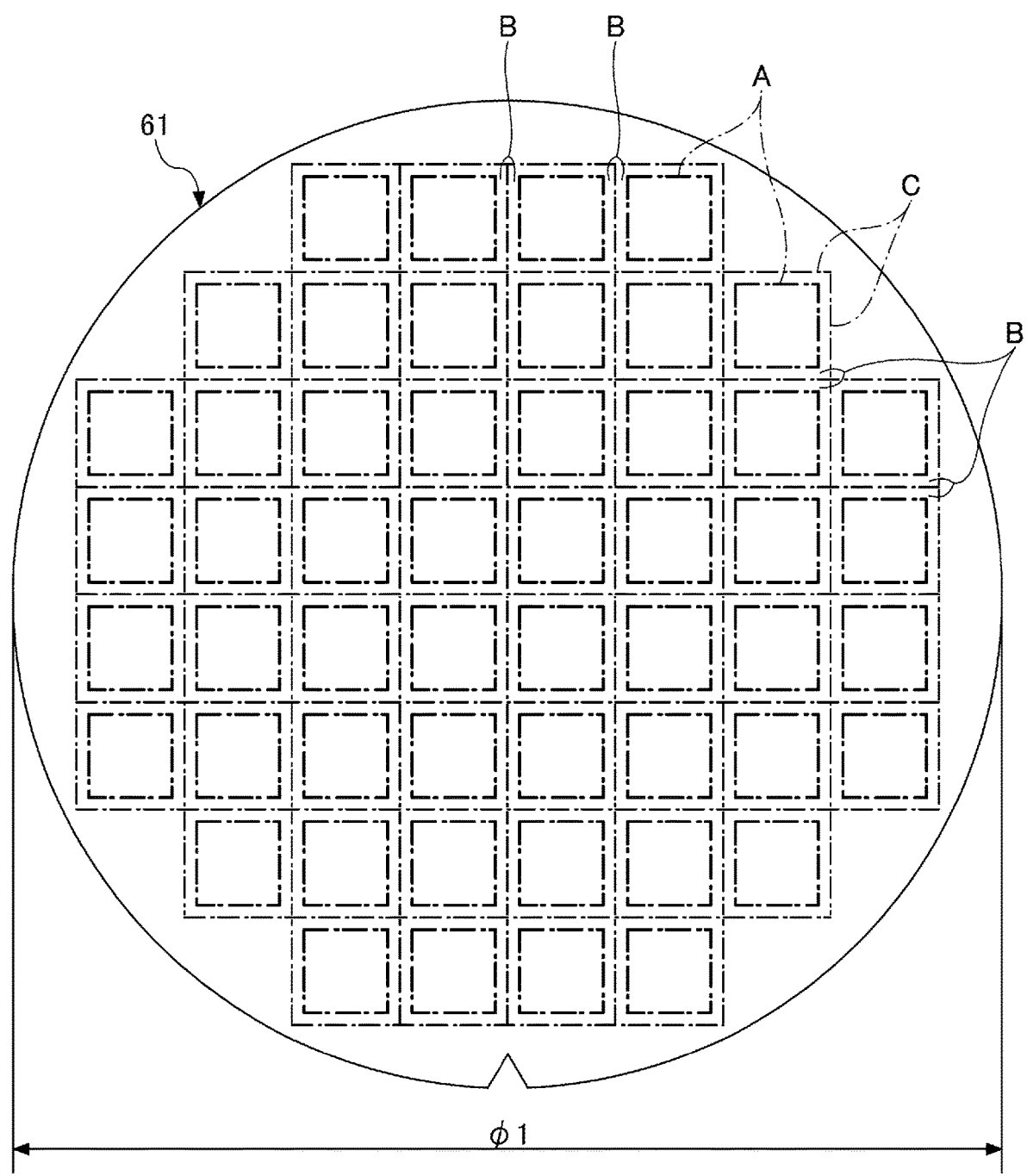
FIG. 3 is a first diagram illustrating a manufacturing process of a semiconductor device according to a first embodiment.

First, in a process illustrated in FIG. 3, a non-thinned substrate 61 is prepared. The substrate 61 defines a plurality of product regions A and a scribe region B for separating each product region A. The product regions A, for example, are arranged vertically and horizontally. The reference C in the scribe region B represents a position where the dicing blade or the like cuts the substrate 61 (hereinafter referred to as a "cutting position C"). Here, for example, the material of the substrate 61 is a silicon wafer. The substrate 61 is circular, for example, and a diameter φ1 may be, for example, 6 inches (about 150 mm), 8 inches (about 200 mm), 12 inches (about 300 mm), or the like. The thickness of the substrate 61 may be, for example, 0.625 mm (if φ1=6 inches), 0.725 mm (if φ1=8 inches), 0.775 mm (if φ1=12 inches), or the like. In the following FIGS. 4 to 14, a cross-section of a product region A illustrated in FIG. 3 is referred to for explanation.

Figure 4:
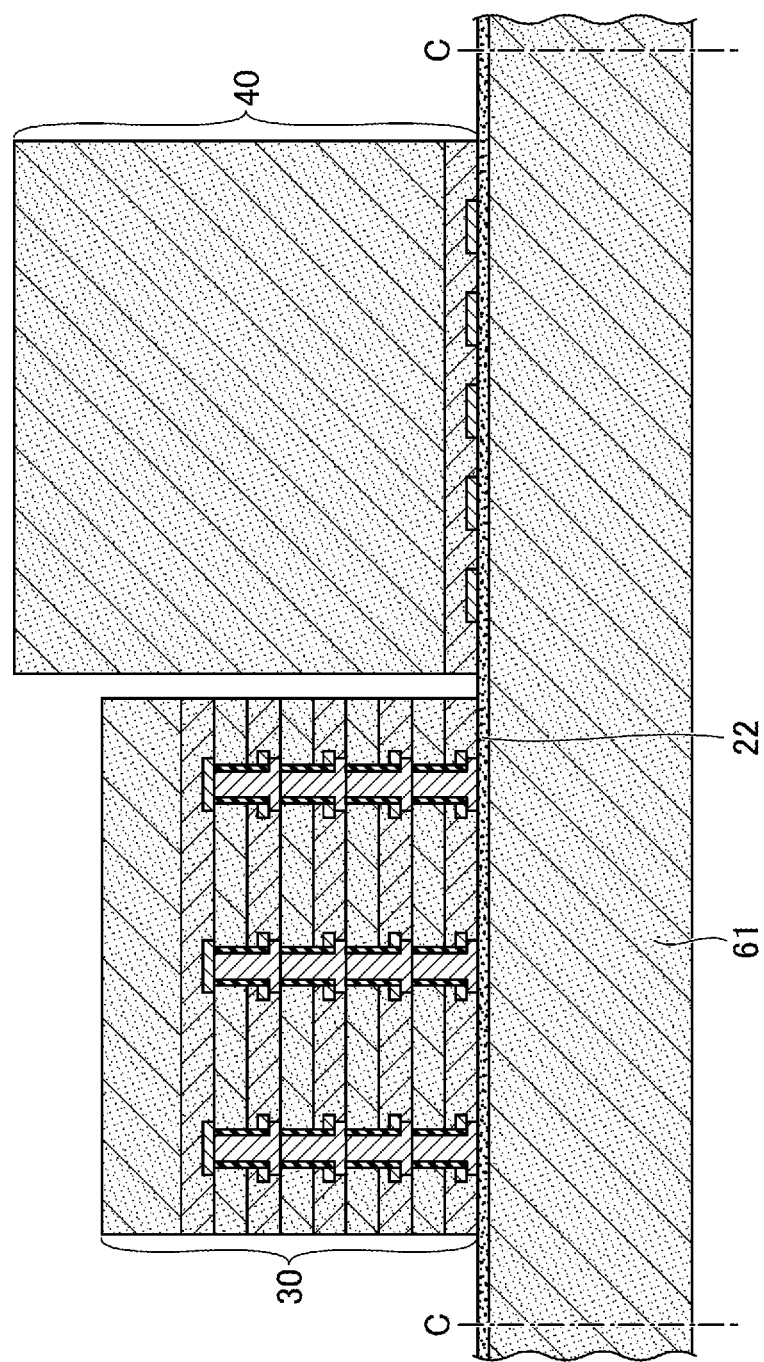
FIG. 4 is a second diagram illustrating the manufacturing process of a semiconductor device according to the first embodiment.

Next, in a process illustrated in FIG. 4, a semiconductor chip stack 30 and a semiconductor chip 40 are attached to each product region A on one face of the substrate 61, while facing the electrode pad forming side toward the substrate 61 (that is, in a face-down state). The substrate 61, the semiconductor chip stack 30 and the semiconductor chip 40 may be attached, for example, via an adhesive layer 22. The material of the adhesive layer 22 and the like are as described above. The adhesive layer 22 can be formed on one face of the substrate 61 by, for example, a spin-coating method. The adhesive layer 22 may be formed on one face of the substrate 61 using a film-like adhesive or the like instead of a spin-coating method. The semiconductor chip stack 30 may be manufactured using wafer-on-wafer techniques.

Figure 5:
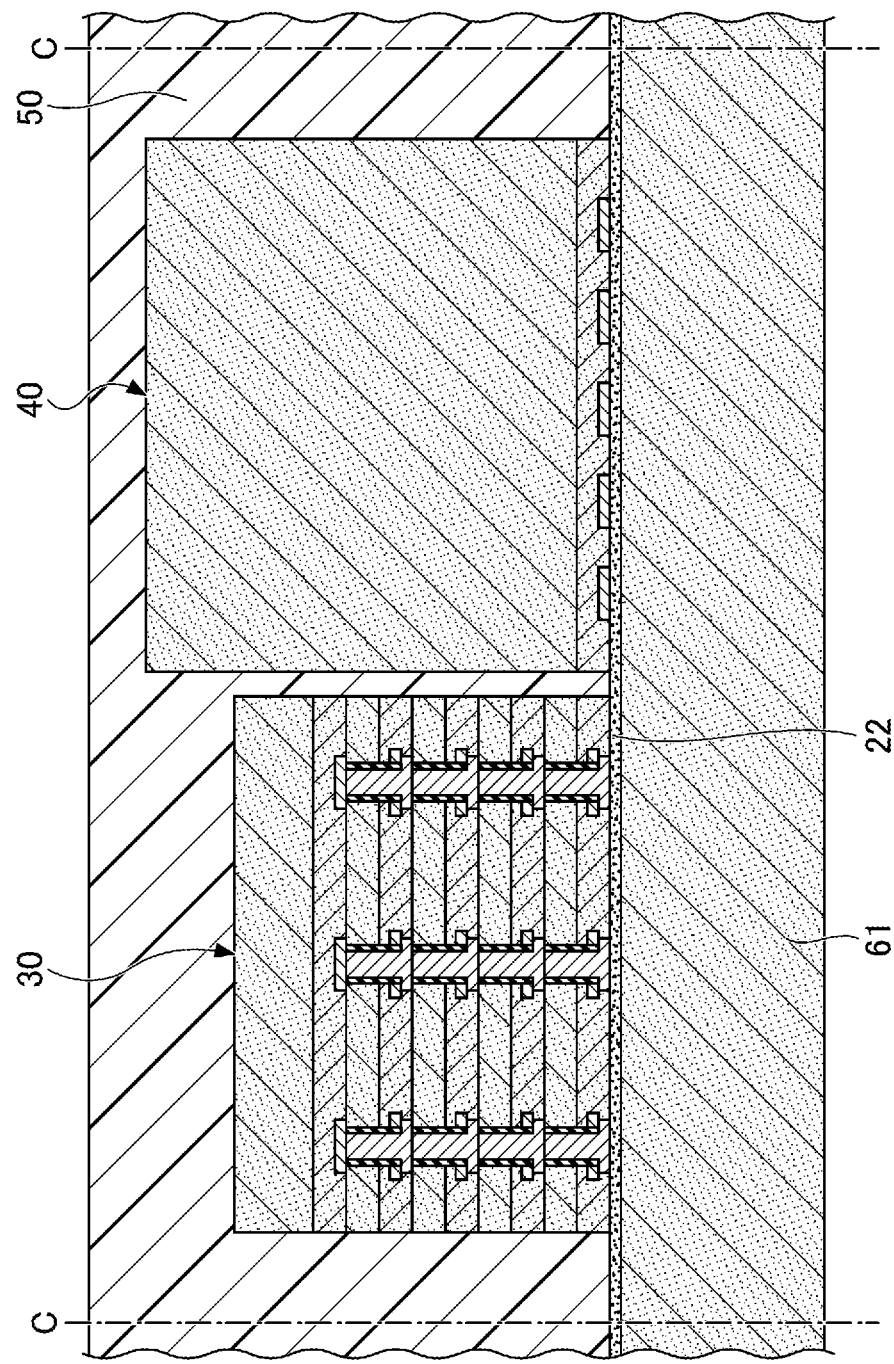
FIG. 5 is a third diagram illustrating the manufacturing process of a semiconductor device according to the first embodiment.

Next, in a process illustrated in FIG. 5, a resin layer 50 coating at least lateral faces of the semiconductor chip stack 30 and the semiconductor chip 40 attached to each product region A are formed on one face of the substrate 61. In this process, it is sufficient for the lateral faces of the semiconductor chip stack 30 and the lateral faces of the semiconductor chip 40 to be sealed until the lateral faces of the semiconductor chip stack 30 and the lateral faces of the semiconductor chip 40 are completely sealed by the resin layer 50 after the semiconductor chip stack 30 and the semiconductor chip 40 are thinned in the process illustrated in FIG. 6, which will be described later. However, the resin layer 50 may be formed to coat the lateral and back faces of the semiconductor chip stack 30 and the lateral and back faces of the semiconductor chip 40.

The material of the resin layer 50 and the like are as described above. The resin layer 50 can be formed, for example, by coating the substrate 61 by a compression molding process and then heating the resin layer 50 to a predetermined curing temperature to cure. The resin layer 50 may be formed using a squeegee method instead of the compression molding method or may be formed using a film-like resin attaching method.

Figure 6:
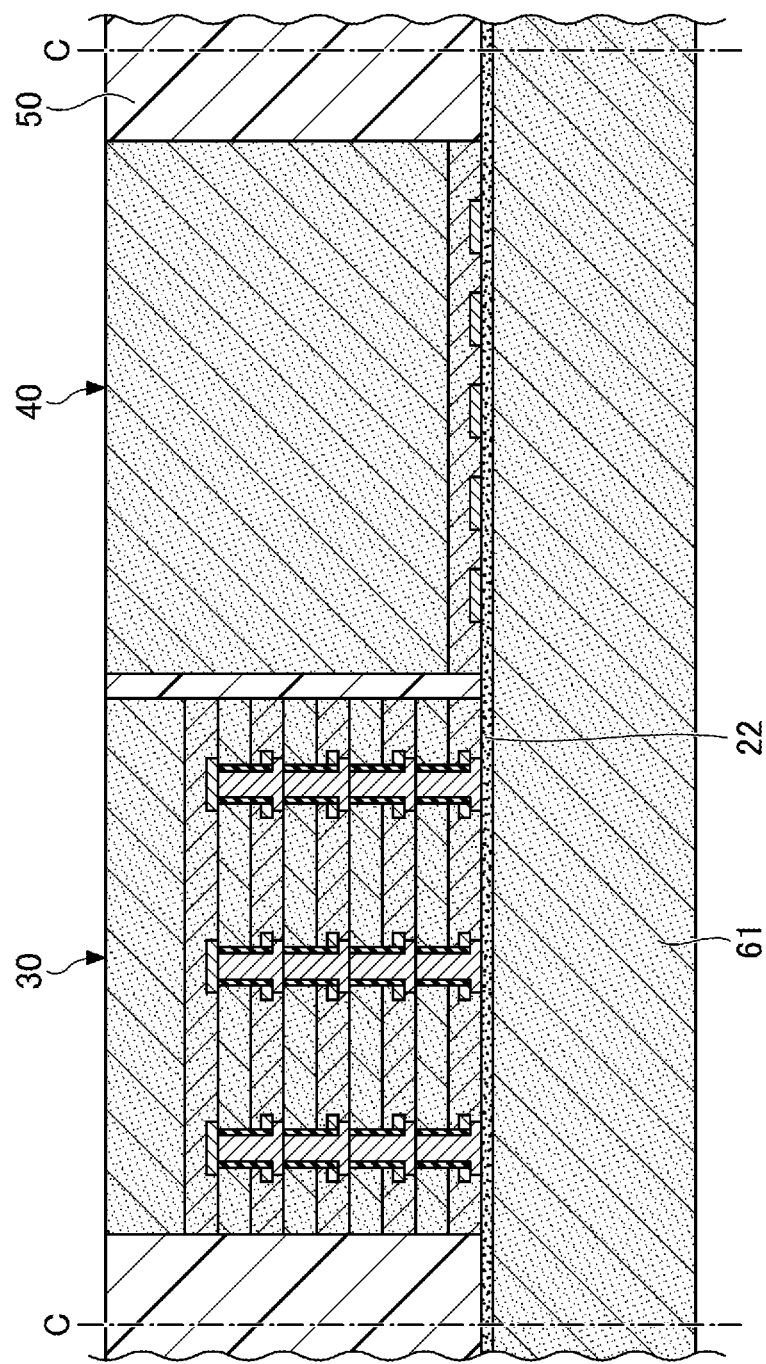
FIG. 6 is a fourth diagram illustrating the manufacturing process of a semiconductor device according to the first embodiment.

Next, in a process illustrated in FIG. 6, an unwanted portion of the resin layer 50 and the back faces of the semiconductor chip stack 30 and the semiconductor chip 40 attached to each product region A are ground with a grinder or the like to expose the back faces of the semiconductor chip stack 30 and the semiconductor chip 40 attached to each product region A while thinning the back faces. Thus, the semiconductor chip stack 30 and the semiconductor chip 40 are thinned and the lateral faces of the thinned semiconductor chip stack 30 and the semiconductor chip 40 are sealed with the resin layer 50. In this case, dry polishing, chemical mechanical polishing (CMP) or wet etching may be used together. In the case of the number of stacks illustrated in FIG. 6, the thickness of the thinned semiconductor chip stack 30 and the semiconductor chip 40 may be, for example, about 20 μm to about 50 μm. The minimum thickness of each of the semiconductor chips $30_1$ to $30_5$ and the minimum thickness of the semiconductor chip 40 may be 4 μm.

Figure 7:
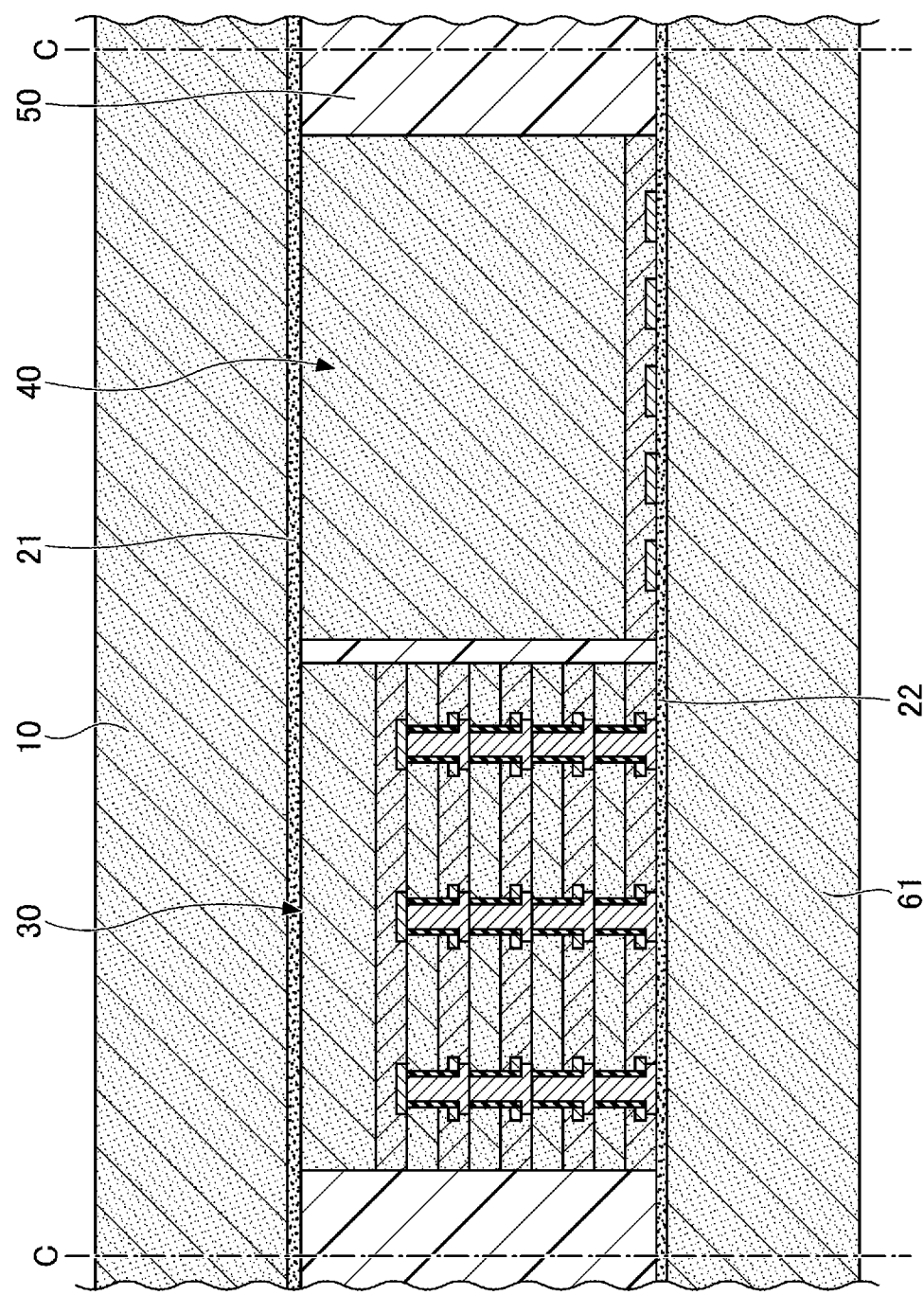
FIG. 7 is a fifth diagram illustrating the manufacturing process of a semiconductor device according to the first embodiment.

Next, in a process illustrated in FIG. 7, a substrate 10 serving as a support is prepared and the substrate 10 is fixed to the back faces of the semiconductor chip stack 30 and the semiconductor chip 40 attached to the respective product region A opposite the electrode pad forming sides. Here, for example, the substrate 10 is a silicon wafer. The thickness of the substrate 10 may be, for example, the same as the thickness of the substrate 61 prior to thinning. The substrate 10 may be fixed to the semiconductor chip stack 30 and the semiconductor chip 40, for example, via an adhesive layer 21. The material of the adhesive layer 21 and the like are as described above. The adhesive layer 21 can be formed on the back face of the semiconductor chip stack 30 and the semiconductor chip 40 and on the resin layer 50, for example, in a manner similar to the adhesive layer 22.

Figure 8:
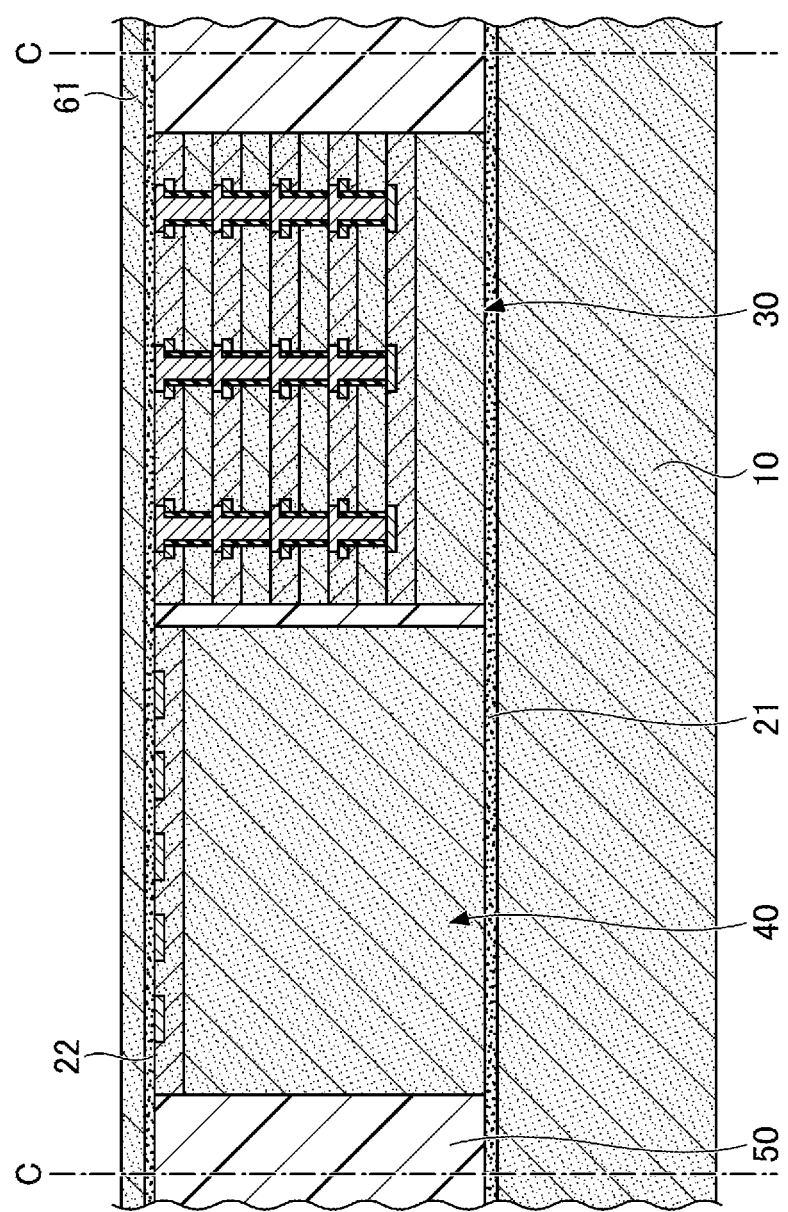
FIG. 8 is a sixth diagram illustrating the manufacturing process of a semiconductor device according to the first embodiment.

Next, in a process illustrated in FIG. 8, the other side of the substrate 61 is ground with a grinder or the like, and thus the other side of the substrate 61 is thinned. In this case, dry polishing, CMP, wet etching, and the like may be used together. The thinned substrate 61 may be, for example, about 1 μm to about 10 μm thick. By making the thinned substrate 61 about 1 μm to about 10 μm thick, the processing time of the via hole is significantly reduced, and the aspect ratio is reduced by thinning, thereby improving filling properties and coverage properties. The structure illustrated in FIG. 8 is depicted in a state in which the top and the bottom of the structure illustrated in FIG. 7 are inverted.

Figure 9:
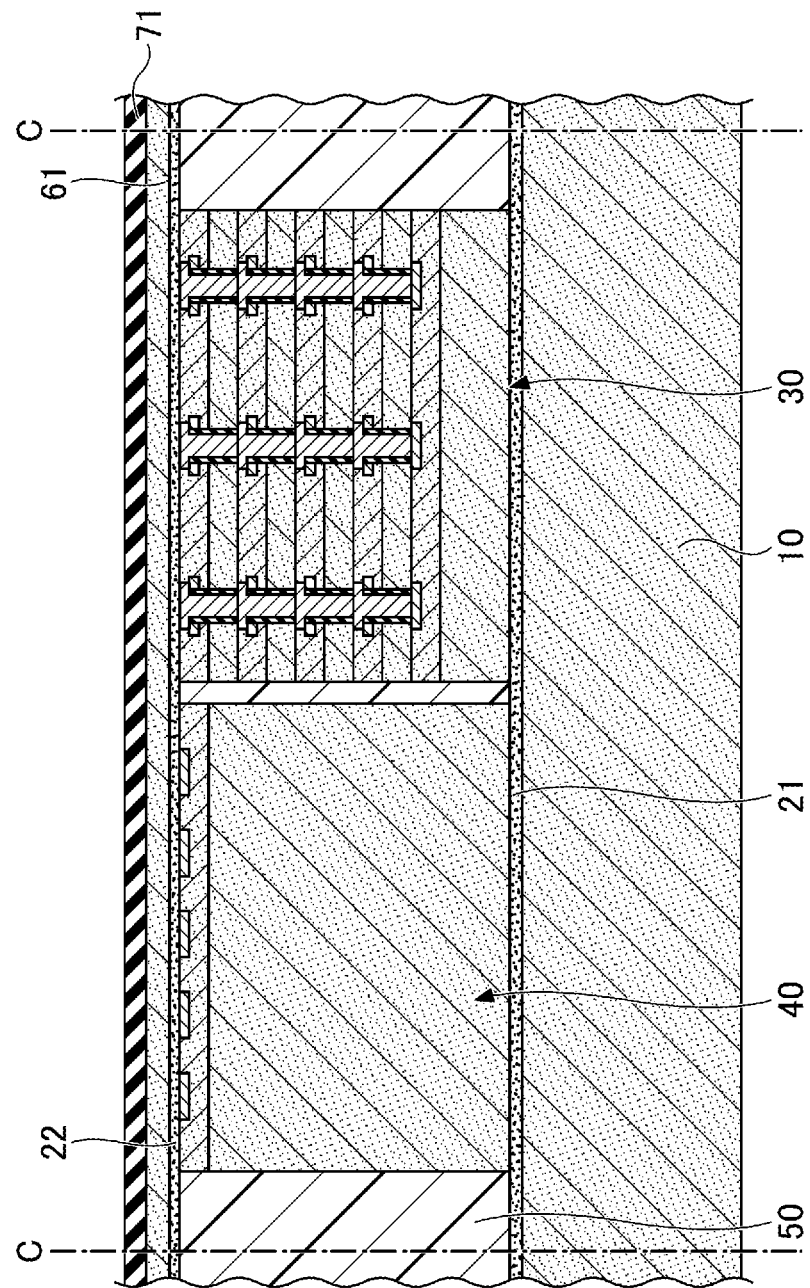
FIG. 9 is a seventh diagram illustrating the manufacturing process of a semiconductor device according to the first embodiment.

Next, in a process illustrated in FIG. 9, an inorganic insulating layer 71 is formed on the other side of the substrate 61. The material and the thickness of the inorganic insulating layer 71 are as described above. The inorganic insulating layer 71 can be formed, for example, by a plasma CVD process or the like. The inorganic insulating layer 71 is preferably formed after the surface of the substrate 61 is exposed, for example, by Dilute Hydrogen Fluoride (DHF) cleaning or argon sputtering. Therefore, it is possible to form the inorganic insulating layer 71 having a high film density and excellent moisture resistance and electrical insulating resistance. Although the spin coating can be applied only to the wafer shape, the organic insulating layer has a small film density, does not have sufficient moisture resistance, does not have sufficient electrical insulating resistance, and does not have micro-formability. In addition, the organic insulating layer applied by spin coating needs to be densified by heat treatment after application. On the other hand, the inorganic insulating layer 71 is superior to the organic insulating layer in terms of micro-formability and is also superior to the organic insulating layer in that densification is not required by the heat treatment due to high film density.

Figure 10:
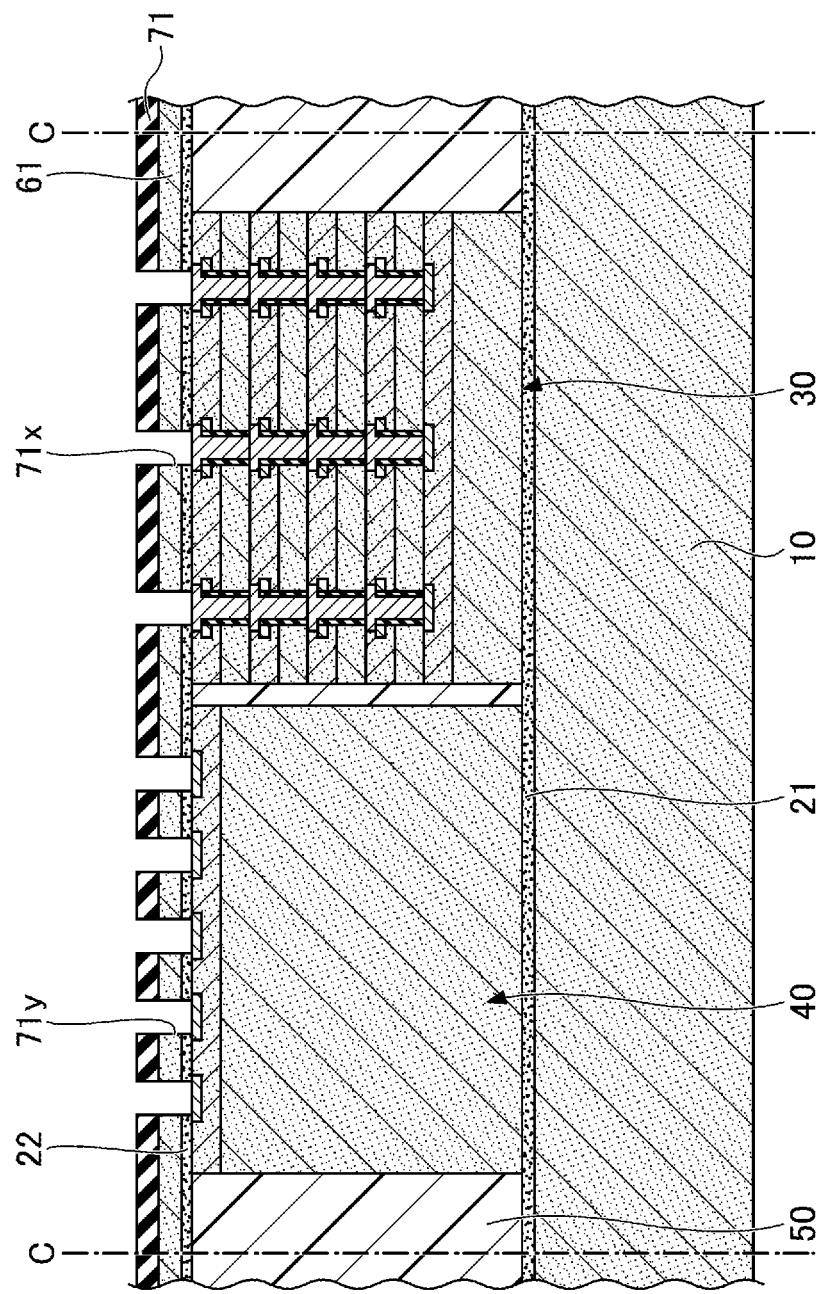
FIG. 10 is an eighth diagram illustrating the manufacturing process of a semiconductor device according to the first embodiment.

Next, in a process illustrated in FIG. 10, via holes 71x and 71y are formed. The via hole 71x penetrates through the inorganic insulating layer 71 and the substrate 61 and is formed so that the surface of the through-electrode 37 of the semiconductor chip $30_5$ of the semiconductor chip stack 30 is exposed. The via hole 71y penetrates through the inorganic insulating layer 71 and the substrate 61 and is formed so that the surface of the electrode pad 43 of the semiconductor chip 40 is exposed. The via holes 71x and 71y can be formed, for example, by dry etching. The via holes 71x and 71y may be, for example, circular in a plan view having the diameter of about 0.5 μm to about 5 μm.

Figure 11:
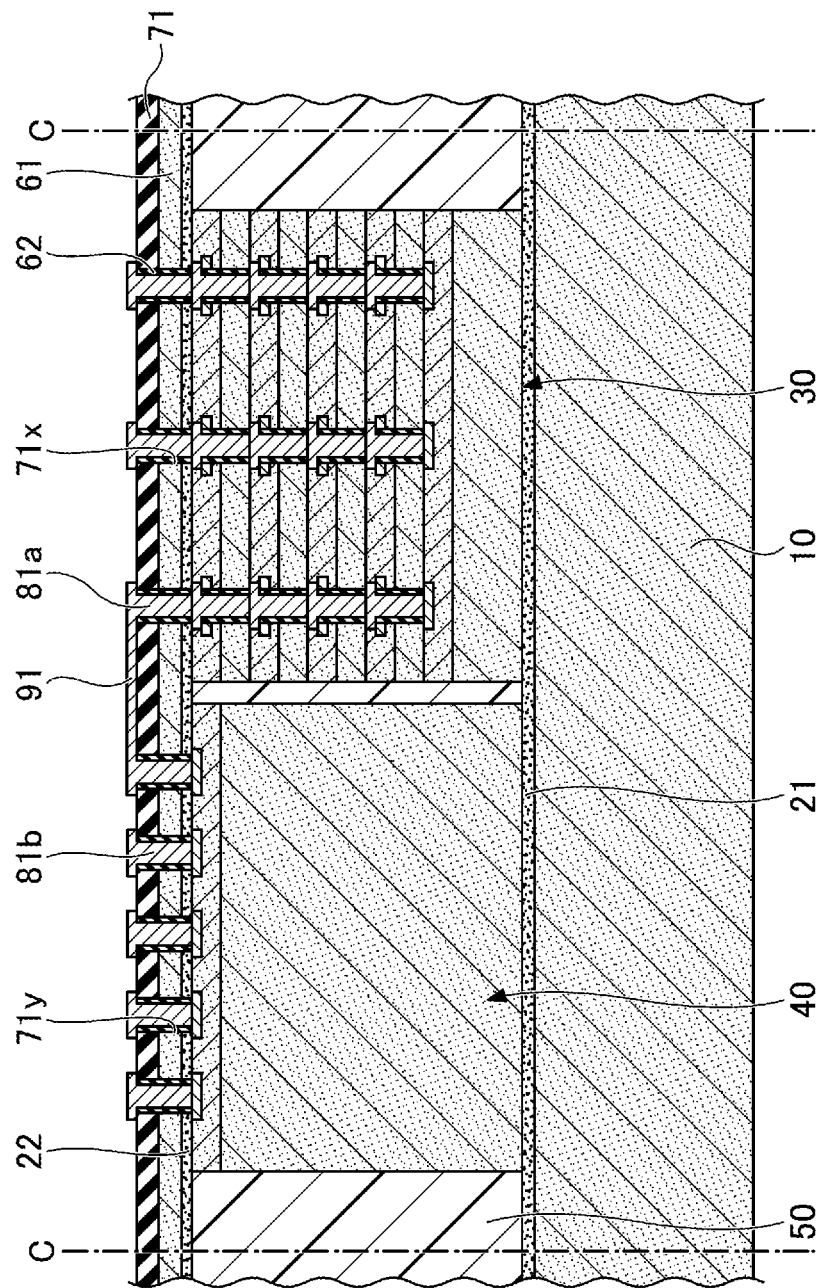
FIG. 11 is a ninth diagram illustrating the manufacturing process of a semiconductor device according to the first embodiment.

Next, in a process illustrated in FIG. 11, the vertical interconnections 81a and 81b and the horizontal interconnection layer 91 are formed. The vertical interconnections 81a and 81b and the horizontal interconnection layer 91 may be integrally formed, for example, by a damascene interconnection. In this case, first, an insulating film (for example, a SiN film having a thickness of about 10 nm to about 50 nm) having a high etch resistance compared to an inorganic insulating layer 71 is formed on the top face of the inorganic insulating layer 71, and a mask layer (for example, an $SiO_2$ film) having the same thickness as the horizontal interconnection layer 91 is formed on the insulating film. The mask layer is etched, thereby forming an opening for opening a region in which the vertical interconnections 81a and 81b and the horizontal interconnection layer 91 are to be formed.

Next, an insulating layer 62 for coating the inner wall surfaces of via holes 71x and 71y is formed. The insulating layer 62 may be formed, for example, by plasma CVD or the like, by forming an insulating layer continuously coating the inner wall surface of via holes 71x and 71y, the through-electrode 37 being exposed in the via holes 71x and 71y and the top face of the electrode pads 43, and by removing a portion other than the portion that coats the inner wall surface of the via holes 71x and 71y by RIE (Reactive Ion Etching) or the like.

Next, for example, a barrier layer (for example, a Ta/TaN layer, a Ti/TiN layer, or the like) is formed by a sputtering method to continuously coat the portions exposed from the opening of the mask layer, and a power supply layer (for example, a Cu layer) is formed on the barrier layer by a sputtering method or the like. Next, an electrolytic plating layer (for example, a Cu layer) is formed on the power supply layer exposed in the opening of the mask layer by an electrolytic plating method that supplies power through the power supply layer. The electrolytic plating layer fills the via holes 71x and 71y and protrudes from the top face of the mask layer. The top face of the electrolytic plating layer protruding from the top face of the mask layer is flattened by CMP or the like. The mask layer is then removed. When the mask layer is removed, an insulating film formed on the lower layer of the mask layer becomes an etching stopper layer. As described above, the vertical interconnections 81a and 81b including the electrolytic plating layer stacked on the power supply layer and the horizontal interconnection layer 91 can be integrally formed.

The vertical interconnections 81a and 81b and the horizontal interconnection layer 91 may be separately formed. In this case, for example, after the insulating layer 62 is formed in the same manner as above, the vertical interconnections 81a and 81b are formed in the via holes 71x and 71y by the same electrolytic plating method as discussed above. In addition, in the vertical interconnections 81a and 81b, the portions protruding from the top face of the inorganic insulating layer 71 are flattened by CMP or the like. Next, a barrier layer (for example, Ta/TaN, Ti/TiN, and the like) that continuously coats the top face of the inorganic insulating layer 71 and the top faces of the vertical interconnections 81a and 81b is formed by a sputtering method, and the like, and a metal layer (for example, Al, and the like) is formed on the barrier layer by the sputtering method. The metal and barrier layers are then patterned by photolithography, thereby forming the horizontal interconnection layer 91.

Figure 12:
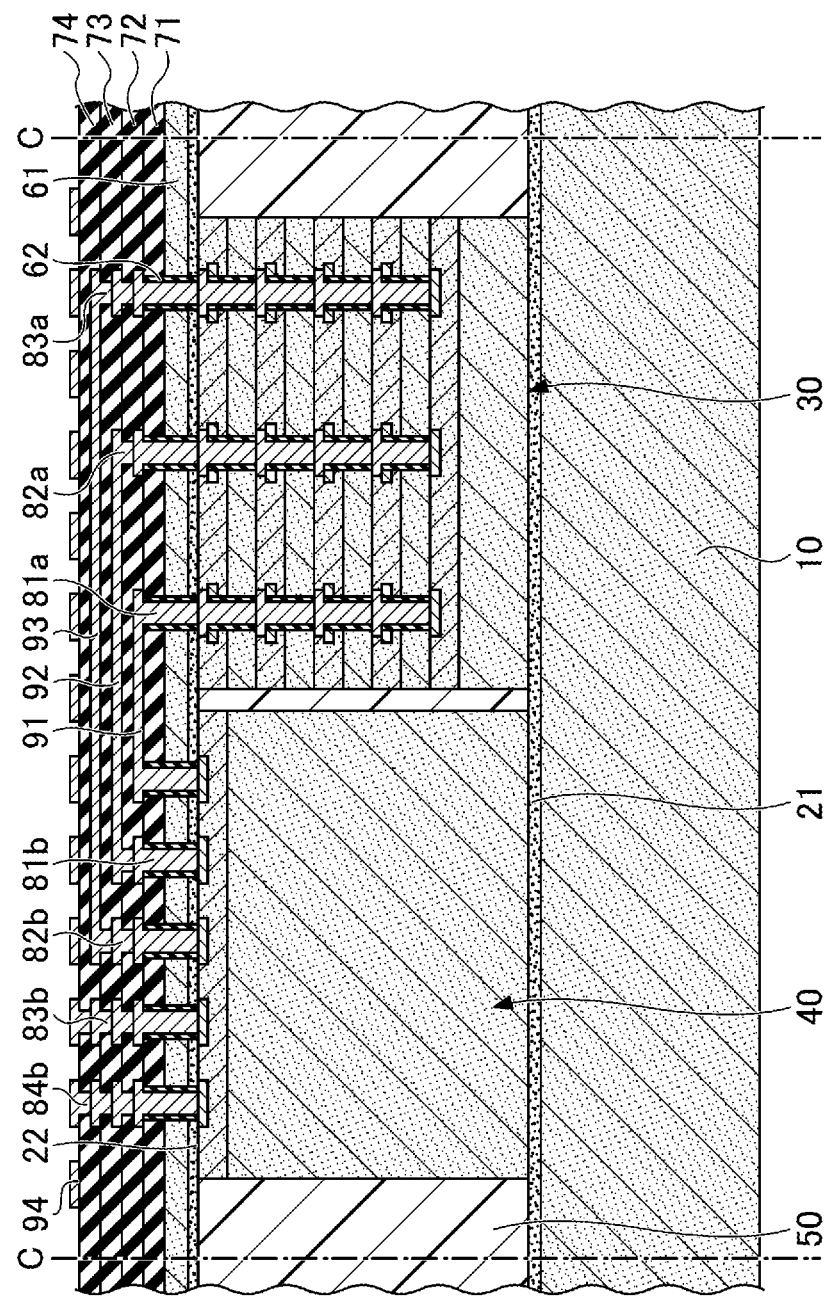
FIG. 12 is a tenth diagram illustrating the manufacturing process of a semiconductor device according to the first embodiment.

Next, in a process illustrated in FIG. 12, the processes in FIGS. 9 to 11 are repeated a necessary number of times. However, the insulating layer 62 is not formed in the process. That is, the inorganic insulating layer 72 coating the horizontal interconnection layer 91 is formed on the surface of the inorganic insulating layer 71 opposite the substrate 61 (the top face in FIG. 12) in the same manner as in FIG. 9. After forming a via hole penetrating through the inorganic insulating layer 72, the vertical interconnections 82a and 82b and the horizontal interconnection layer 92 are integrally formed by a damascene interconnection, for example. Then, an inorganic insulating layer 73 is formed on the face of the inorganic insulating layer 72 opposite the inorganic insulating layer 71 (the top face in FIG. 12) to coat the horizontal interconnection layer 92. After forming a via hole penetrating through the inorganic insulating layer 73, the vertical interconnections 83a and 83b and the horizontal interconnection layer 93 are formed integrally by a damascene interconnection, for example.

Subsequently, an inorganic insulating layer 74 coating the horizontal interconnection layer 93 is formed on the face of the inorganic insulating layer 73 opposite the inorganic insulating layer 72 (top face in FIG. 12). After forming a via hole penetrating through the inorganic insulating layer 74, a vertical interconnection 84b and an electrode pad 94 are integrally formed, for example, by a damascene interconnection. In this process, the through-electrodes 37 of the semiconductor chip stack 30 and the necessary portions of the electrode pads 43 of the semiconductor chip 40 are electrically connected to each other via a horizontal interconnection of the vertical interconnections 81a to 83a, the vertical interconnections 81b to 83b, and the horizontal interconnection layers 91 to 93.

As described in the process of FIG. 11, the vertical interconnections 82a and 82b may be formed separately from horizontal interconnection layer 92. Also, the vertical interconnections 83a and 83b may be formed separately from the horizontal interconnection layer 93. Similarly, a vertical interconnection 84b may be formed separately from the electrode pad 94. Also, they may be optionally combined with the damascene interconnection. For example, the vertical interconnections 81a and 81b and the horizontal interconnection layer 91 are separately formed, and the second and subsequent interconnections, that is, the vertical interconnections 82a and 82b and the horizontal interconnection layer 92, the vertical interconnections 83a and 83b and the horizontal interconnection layer 93, and the vertical interconnection 84b and the electrode pad 94 may be formed as the damascene interconnection.

Figure 13:
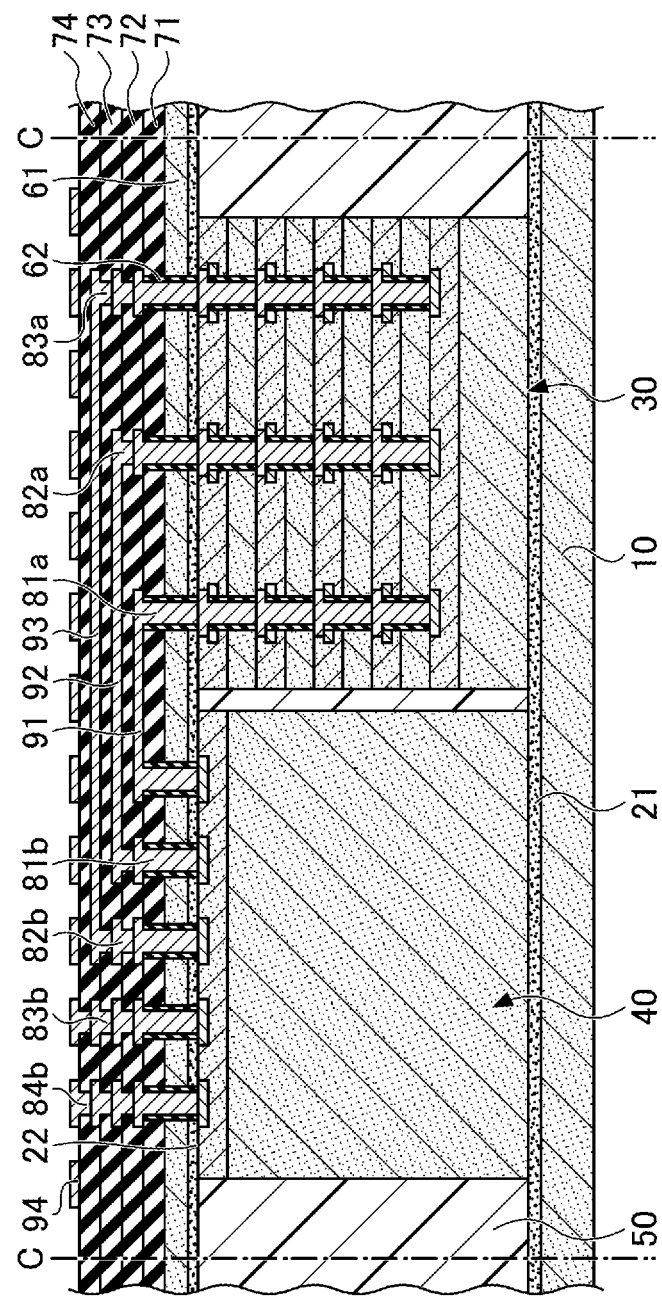
FIG. 13 is an eleventh diagram illustrating the manufacturing process of a semiconductor device according to the first embodiment.
Figure 14:
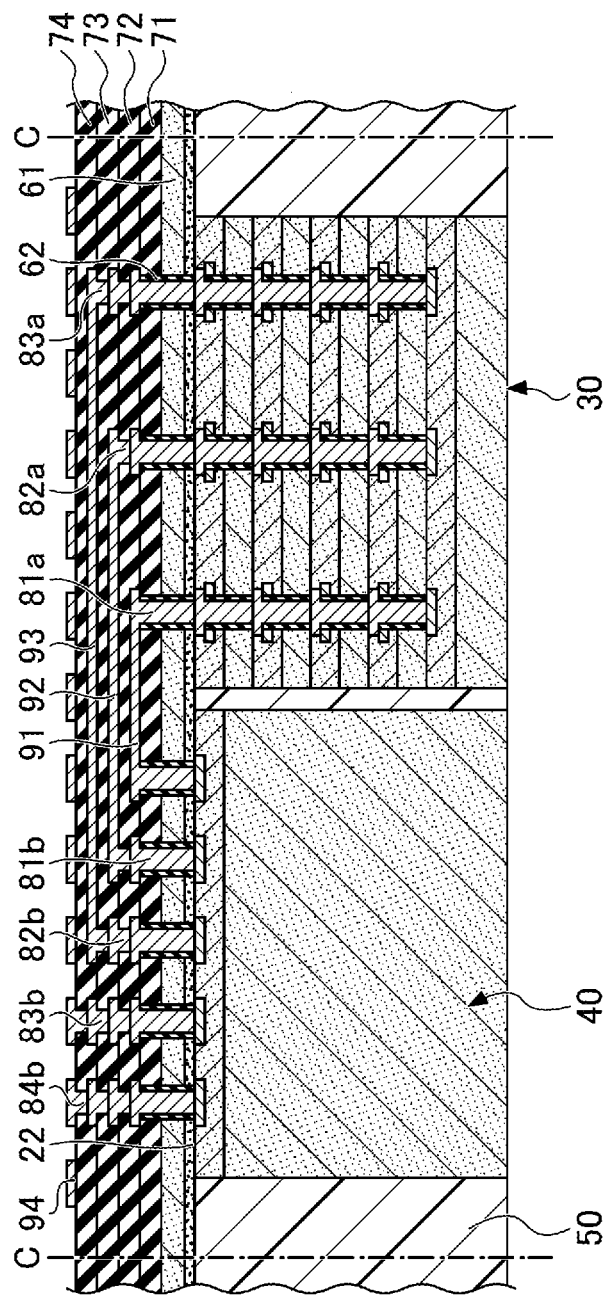
FIG. 14 is a twelfth diagram illustrating the manufacturing process of a semiconductor device according to the first embodiment.

Then, after a process illustrated in FIG. 12, a plurality of semiconductor devices 1 illustrated in FIG. 1 is manufactured by cutting and separating the structure illustrated in FIG. 12 at the cutting position C by a dicing blade or the like. Further, a process of removing at least a portion of the substrate 10 may be provided prior to the separation. For example, as illustrated in FIG. 13, the back face of the substrate 10 may be ground with a grinder or the like to thin the substrate 10. Alternatively, as illustrated in FIG. 14, the back faces of the substrate 10 and the adhesive layer 21 may be ground and removed by a grinder and the like, and further the back faces of the semiconductor chip stack 30, the semiconductor chip 40, and the resin layer 50 may be ground to thin the semiconductor chip stack 30, the semiconductor chip 40, and the resin layer 50. By adding these processes, the entire semiconductor device 1 can be thinned.

Thus, the semiconductor device 1 uses the inorganic insulating layers 71 to 74 instead of an insulating layer using an organic material as an insulating layer for providing interconnection that electrically connects the semiconductor chip stack 30 to the semiconductor chip 40. The inorganic insulating layers 71 to 74 are then used for multilayer interconnections including vertical and horizontal interconnections at a wafer level. Therefore, it is possible to reduce the leakage current between the multilayer interconnections and to increase the density.

In the semiconductor device 1, multiple layers of interconnections can be performed at the wafer level and electrically connected without using bumps conventionally used for the connection, thereby eliminating the resistance of the bumps and the parasitic electrical capacity of the bumps. For example, the resistance of the semiconductor device 1 may be about 70 mΩ), while the series resistance of the conventional interconnection and the bump may be about 100 mΩ). That is, in the semiconductor device 1, the resistance of the horizontal interconnection can be reduced by about 30% compared to the conventional method.

Further, in the semiconductor device 1, by performing the multilayer interconnections at the wafer level, the line/space of the horizontal interconnections can be about 5 μm/1 μm, 3 μm/0.5 μm, and 1 μm/0.5 μm. Because the line/space of the horizontal interconnections is conventionally about 2 μm/2 μm, in the semiconductor device 1, the degree of integration of the horizontal interconnections can be increased up to about 4 times that of the conventional interconnection, and the density of the horizontal interconnections increases proportionally to the number of multilayered interconnections. Thus, the density of the interconnections that connects the semiconductor chip stack 30 to the semiconductor chip 40 can be increased.

Therefore, in the semiconductor device 1, because the bit width of the data bus is widened, broadening the bandwidth is possible. For example, by quadrupling the interconnection density per inorganic insulating layer and forming four layers, the bandwidth can be increased by 16 times. In other words, if the same bandwidth is used, the data can be transferred at a frequency of $1/16$, and the power consumption can be reduced to $1/16$.

In the semiconductor device 1, the vertical interconnections formed in the inorganic insulating layers 71 to 74 are directly and electrically connected to each of the electrode pads of the semiconductor chip stack 30 and the semiconductor chips 40 without bumps. As a result, the interconnection resistance is reduced, and the broadband semiconductor device 1 can be implemented with low power consumption. Further, by eliminating the mechanical connection using a bump, high reliability against temperature stress can be implemented for the interconnection connecting the semiconductor chip stack 30 to the semiconductor chip 40.

Further, the length of the vertical interconnection may be about 10 μm in the semiconductor device 1 compared to about 50 μm in the conventional interconnection. As a result, in the semiconductor device 1, if the cross-sectional area of the vertical interconnection is constant, the resistance per one layer of the vertical interconnection can be set to $1/5$ of that of the conventional art.

First Modification of First Embodiment

A first modification of the first embodiment illustrates an example in which a semiconductor chip stack and a semiconductor chip are attached to a recess formed in a substrate. In the first modification of the first embodiment, the description of the same component as that of the embodiment described above may be omitted.

Figure 15:
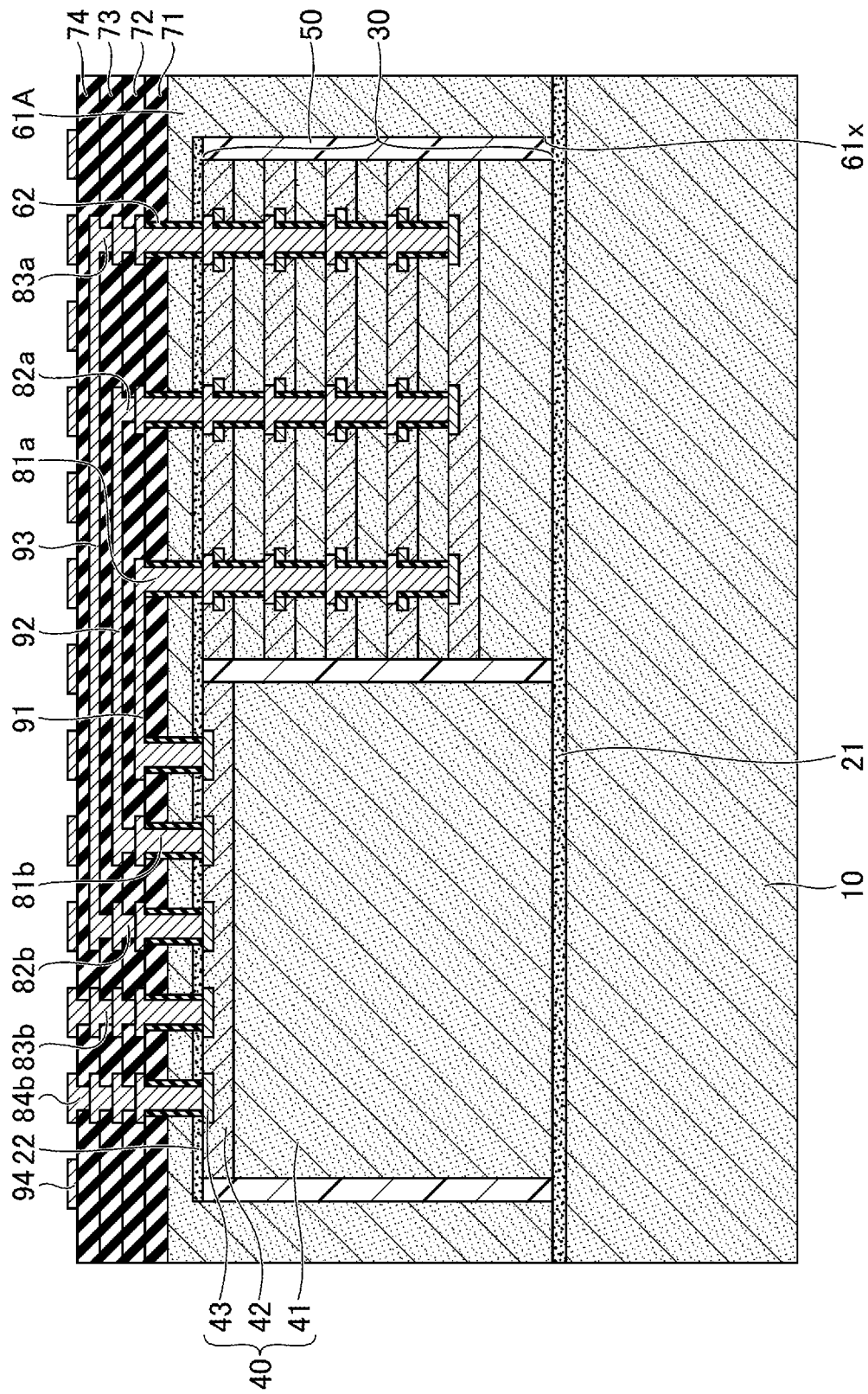
FIG. 15 is a cross-sectional view illustrating a semiconductor device according to a first modification of the first embodiment.

FIG. 15 is a cross-sectional view illustrating a semiconductor device according to a first modification of the first embodiment. Referring to FIG. 15, the semiconductor device 1A according to the first modification of the first embodiment differs from the semiconductor device 1 (see FIG. 1, and the like) in that the substrate 61 is replaced with a substrate 61A.

On one side of the substrate 61A (the lower side in FIG. 15), a recess 61x is provided that opens to the substrate 10 side. The planar shape of the recess 61x is, for example, rectangular. The sidewall thickness of the recess 61x may be, for example, in the range of about 20 μm to about 100 μm. The semiconductor chip stack 30 and the semiconductor chip 40 are attached in the recess 61x to their respective electrode pad forming sides facing the bottom side of recess 61x. In the substrate 61A, for example, Cu interconnection may be previously embedded in the portion surrounding the outer periphery of semiconductor chip stack 30 and the semiconductor chip 40 (the portion forming the sidewall of recess 61x). Alternatively, after the semiconductor chip stacking, the Cu interconnection may be formed by the interconnection forming method described above.

These can be used for power supply or as interconnection to improve thermal conduction, as necessary.

Figure 16:
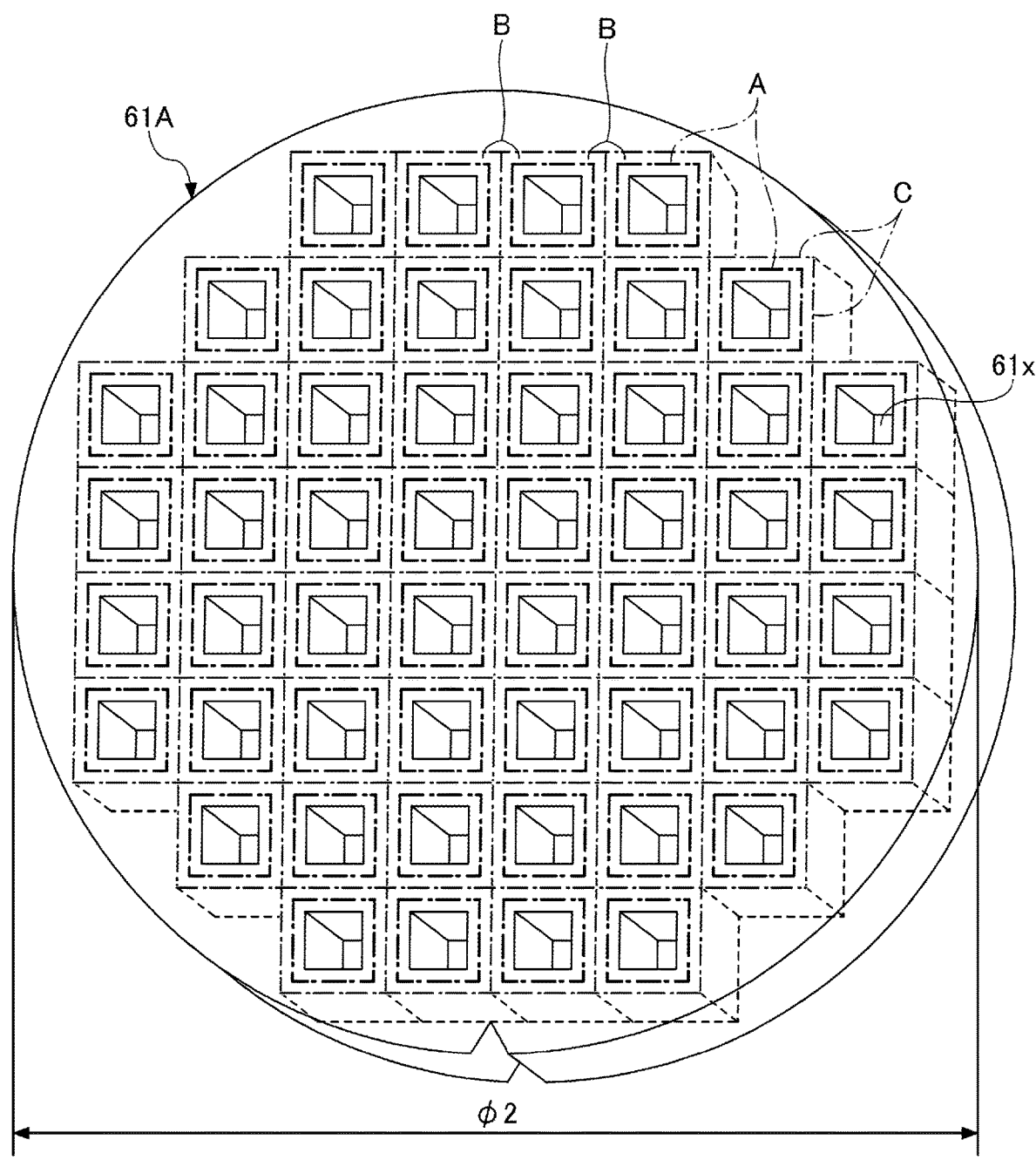
FIG. 16 is a diagram illustrating a first manufacturing process of a semiconductor device according to a first modification of the first embodiment.
Figure 17:
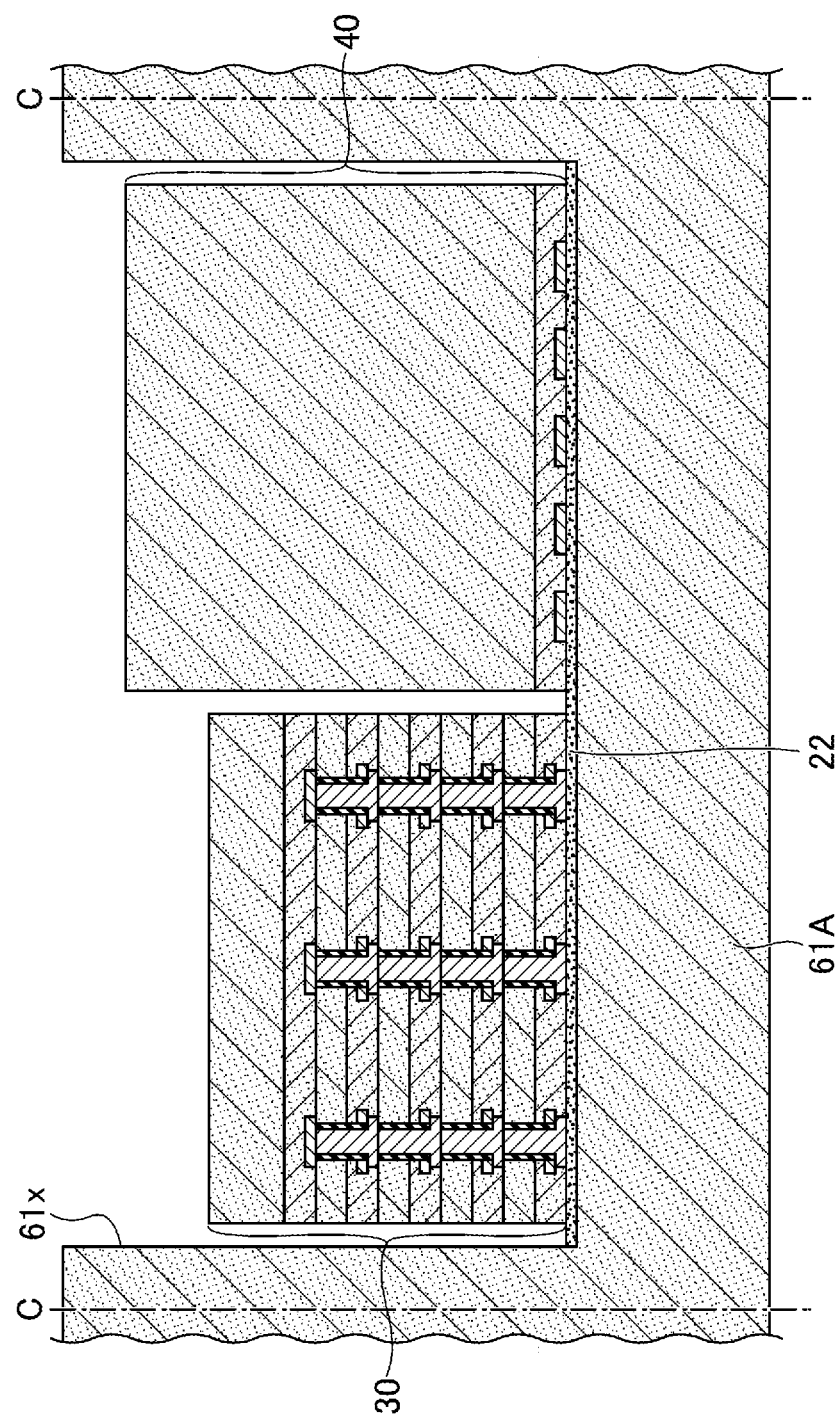
FIG. 17 is a diagram illustrating a second manufacturing process of a semiconductor device according to a first modification of the first embodiment.
Figure 18:
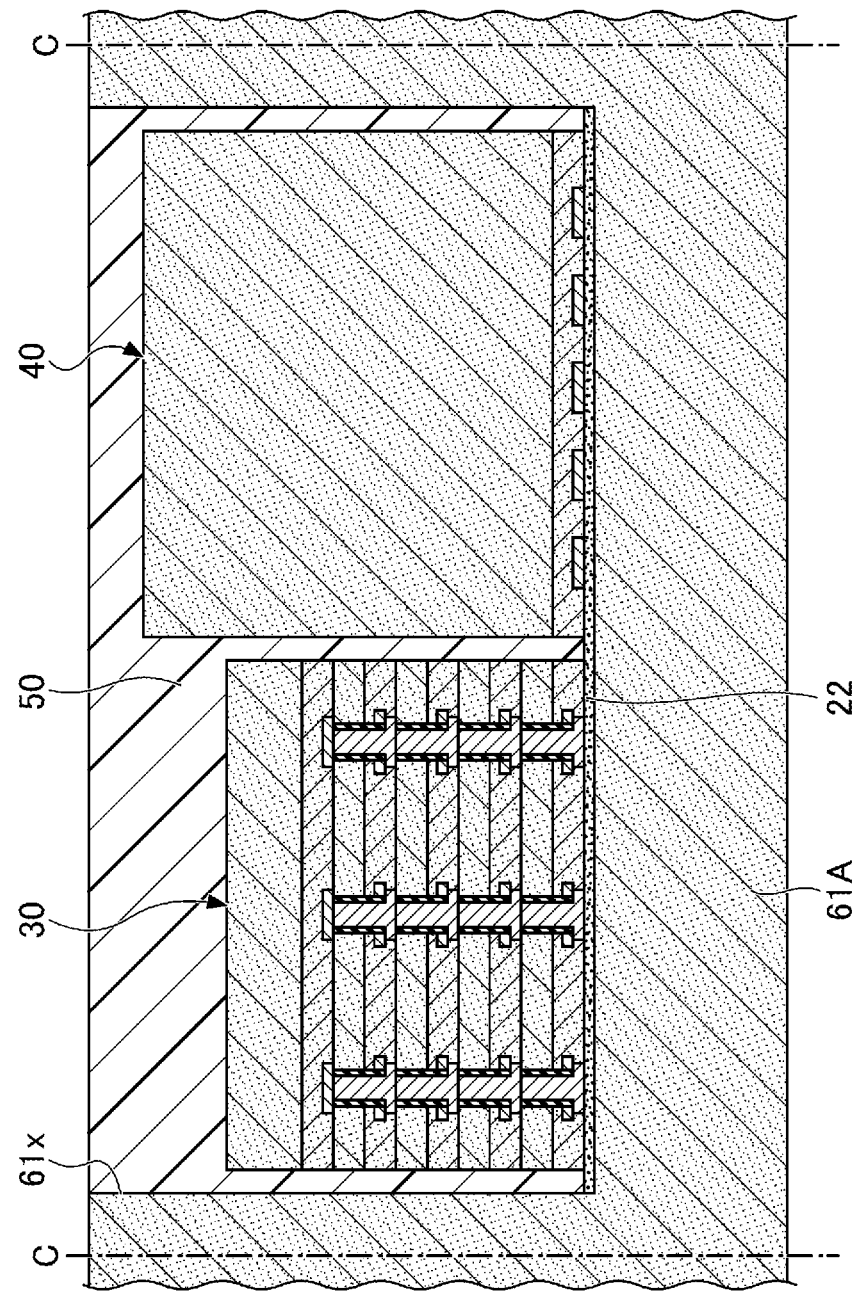
FIG. 18 is a diagram illustrating a third manufacturing process of a semiconductor device according to a first modification of the first embodiment.

FIGS. 16 to 18 are diagrams illustrating a manufacturing process of a semiconductor device according to a first modification of the first embodiment.

First, in a process illustrated in FIG. 16, a non-thinned substrate 61A is prepared. In the substrate 61A, a plurality of product regions A and a scribe region B that separates each product region A are defined. The product regions A, for example, are arranged vertically and horizontally. The reference C in the scribe region B represents a position where the dicing blade or the like cuts the substrate 61A (hereinafter referred to as a "cutting position C"). Each product region A includes the recess 61x, and the side wall of the recess 61x becomes the cutting position C. The recess 61x can be formed, for example, by performing a RIE (Reactive Ion Etching) or the like on the flat substrate 61A.

Here, for example, the material of substrate 61A is a silicon wafer. The substrate 61A may be, for example, circular, and the diameter φ2 may be, for example, 6 inches (about 150 mm), 8 inches (about 200 mm), 12 inches (about 300 mm), or the like. The thickness of the substrate 61A may be, for example, 0.625 mm (if φ1=6 inches), 0.725 mm (if φ1=8 inches), 0.775 mm (if φ1=12 inches), or the like. The following FIGS. 17 and 18 are described with reference to a cross-section of the product region A illustrated in FIG. 16.

Next, in a process illustrated in FIG. 17, the semiconductor chip stack 30 and the semiconductor chip 40 are attached to the recess 61x formed in each of the product regions A of the substrate 61A while facing the respective electrode pad forming sides of the semiconductor chip stack 30 and the semiconductor chip 40 to the bottom side of the recess 61x (that is, in a face-down state). The semiconductor chip stack 30 and the semiconductor chip 40 may be fixed to the substrate 61A, for example, via an adhesive layer 22. The material and the method of forming the adhesive layer 22 are as described above.

Next, in a process illustrated in FIG. 18, a resin layer 50 coating at least lateral faces of the semiconductor chip stack 30 and the semiconductor chip 40 attached to the recess 61x formed in each of the product regions A of the substrate 61A is formed. In this process, as in the first embodiment, it is sufficient to seal the lateral faces of the semiconductor chip stack 30 and the lateral faces of the semiconductor chip 40 until the lateral faces of the semiconductor chip stack 30 and the lateral faces of the semiconductor chip 40 are completely sealed with the resin layer 50 after the semiconductor chip stack 30 and the semiconductor chip 40 are thinned. However, the resin layer 50 may be formed to cover the lateral and back faces of the semiconductor chip stack 30 and the lateral and back faces of the semiconductor chip 40. For example, the resin layer 50 may be formed to fill the recess 61x. The material and the forming method of the resin layer 50 are as described above.

Thereafter, a plurality of semiconductor devices 1A illustrated in FIG. 15 are manufactured by performing the same process as those illustrated in FIGS. 6 to 12 of the first embodiment and cutting the semiconductor devices 1A by a dicing blade or the like at the cutting position C. Similar to FIGS. 13 and 14 of the first embodiment, at least a portion of the substrate 10 may be removed before separation. By adding these processes, the entire semiconductor device 1A can be thinned.

Thus, the recess 61x is provided in the product region A of the substrate 61A, and the semiconductor chip stack 30 and the semiconductor chip 40 are attached in the recess 61x, thereby reducing the volume of the resin layer 50 compared to the first embodiment. When the volume of the resin layer 50 is excessive, the substrate may deform due to the high stress of the resin layer 50. The recess 61x can increase the strength of the substrate 61A and reduce the volume of the resin layer 50, thereby inhibiting the deformation of the substrate 61A.

That is, the resin layer 50 provided in the scribe region is eliminated by providing the recess 61x having a rectangular shape in a plan view. The resin layer 50, for example, is filled with an organic material and filled with a filler such as silica, has a high coefficient of thermal expansion and has several orders of volume greater than the volume of the semiconductor device portion or the volume of the adhesive layer used for joining the components. In other words, because the resin layer is subject to a large amount of stress due to temperature changes, the wafer greatly deforms in the process where the temperature changes after the resin layer fills the recess 61x. If the deformation is great, problems such as inability to deposit a film or inability to perform photolithography or patterning may occur. Because the resin layer 50 provided in the scribe region is not required, the total volume of the resin layer 50 is reduced, thereby reducing stress and inhibiting the deformation of the wafer.

Thus, the disclosure allows for densification and reliability of the interconnection connecting the semiconductor chip to the semiconductor chip stack.

Although the preferred embodiments have been described in detail above, various modifications and substitutions can be applied to the embodiments described above without departing from the scope of the claims.

For example, the above embodiments have illustrated that a semiconductor chip stack and a semiconductor chip are attached to a substrate and are electrically connected to each other via vertical and horizontal interconnections. However, a first semiconductor chip stack and a second semiconductor chip stack may be attached to the substrate and may be electrically connected to each other via vertical and horizontal interconnections. That is, instead of a semiconductor chip that is placed side by side with the semiconductor chip stack, the second semiconductor chip stack may be attached while facing the electrode pad forming side to the substrate side.

Further, the above-described embodiments have described an example of using a semiconductor substrate (silicon wafer) having a circular shape in a plan view. However, the semiconductor substrate is not limited to a circular shape in a plan view, and may be, for example, a panel-shaped substrate such as a rectangle in a plan view.

The material of the semiconductor substrate is not limited to silicon, and may be, for example, germanium or sapphire.

What is claimed is:

1. A method for manufacturing a semiconductor device, the method comprising:
preparing a first substrate having a first face and a second face disposed, the first face having a plurality of product regions defined thereon;
attaching directly or indirectly an electrode pad forming side of each of a semiconductor chip stack and a semiconductor chip to each corresponding product region of the plurality of product regions of the first face of the first substrate;
thinning the second face of the first substrate opposite the first face of the first substrate;
forming a first inorganic insulating layer on the second face of the first substrate;
forming a first vertical interconnection penetrating through the first inorganic insulating layer and the first substrate and directly and electrically connected to an electrode pad of the semiconductor chip stack while forming a second vertical interconnection penetrating through the first inorganic insulating layer and the first substrate and directly and electrically connected to an electrode pad of the semiconductor chip; and
forming a first horizontal interconnection directly and electrically connecting a part of the first vertical interconnection to a part of the second vertical interconnection on a face of the inorganic insulating layer opposite the first substrate.

2. The method as claimed in claim 1, further comprising:
forming a second inorganic insulating layer to coat the first horizontal interconnection on the face of the inorganic insulating layer opposite the first substrate;
forming a third vertical interconnection penetrating through the second inorganic insulating layer and directly and electrically connected to the part of the first vertical interconnection while forming a fourth vertical interconnection penetrating through the second inorganic insulating layer and directly and electrically connected to the part of the second vertical interconnection; and
forming a second horizontal interconnection directly and electrically connecting a part of the third vertical interconnection to a part of the fourth vertical interconnection on a face of the second inorganic insulating layer opposite the first inorganic insulating layer.

3. The method as claimed in claim 1, further comprising:
forming a resin layer to coat at least lateral faces of each of the semiconductor chip stack and the semiconductor chip attached to the each corresponding product region of the first face of the first substrate.

4. The method as claimed in claim 1, further comprising:
thinning a back face of each of the semiconductor chip stack and the semiconductor chip attached to the each corresponding product region.

5. The method as claimed in claim 1,
wherein the each corresponding product region of the first substrate includes a recess, and
wherein the attaching directly or indirectly the electrode pad forming side comprises attaching directly or indirectly the electrode pad forming side of each of the semiconductor chip stack and the semiconductor chip to a bottom face of the recess.

6. The method as claimed in claim 1, further comprising:
fixing a second substrate to a back face of the each of the semiconductor chip stack and the semiconductor chip attached to the each corresponding product region opposite the electrode pad forming side before the thinning the other face of the first substrate.

7. The method as claimed in claim 6, further comprising:
removing at least a part of the second substrate after the forming the first horizontal interconnection.

8. A method for manufacturing a semiconductor device, the method comprising:
preparing a first substrate having a first face and a second face disposed, the first face having a plurality of product regions defined thereon;
attaching directly or indirectly an electrode pad forming side of each of a first semiconductor chip stack and a second semiconductor chip stack to each corresponding product region of the plurality of product regions of the first face of the first substrate;
thinning the second face of the first substrate opposite the first face of the first substrate;
forming a first inorganic insulating layer on the second face of the first substrate;
forming a first vertical interconnection penetrating through the first inorganic insulating layer and the first substrate and directly and electrically connected to an electrode pad of the first semiconductor chip stack while forming a second vertical interconnection penetrating through the first inorganic insulating layer and the first substrate and directly and electrically connected to an electrode pad of the second semiconductor chip stack; and
forming a first horizontal interconnection directly and electrically connecting a part of the first vertical interconnection to a part of the second vertical interconnection on a face of the inorganic insulating layer opposite the first substrate.

9. A semiconductor device comprising:
a first substrate having a first face and a second face disposed, the first face having a plurality of product regions defined thereon;
a semiconductor chip stack and a semiconductor chip each including an electrode pad forming side and attached directly or indirectly to the first face of the first substrate while facing the electrode pad forming side to the first substrate;
a first inorganic insulating layer provided on the second face of the first substrate opposite the first face;
a first vertical interconnection penetrating through the first inorganic insulating layer and the first substrate and directly and electrically connected to an electrode pad of the semiconductor chip stack;
a second vertical interconnection penetrating through the first inorganic insulating layer and the first substrate and directly and electrically connected to an electrode pad of the semiconductor chip; and
a first horizontal interconnection provided on a face of the inorganic insulating layer opposite the first substrate and directly and electrically connecting a part of the first vertical interconnection to a part of the second vertical interconnection.

10. The semiconductor device as claimed in claim 9, further comprising:
a second inorganic insulating layer provided on a face of the inorganic insulating layer opposite the first substrate, the second inorganic insulating layer coating the first horizontal interconnection;
a third vertical interconnection penetrating through the second inorganic insulating layer and directly and electrically connected to a part of the first vertical interconnection unconnected to the first horizontal interconnection;
a fourth vertical interconnection penetrating through the second inorganic insulating layer and directly and electrically connected to a part of the second vertical interconnection unconnected to the first horizontal interconnection; and
a second horizontal interconnection provided on a face of the second inorganic insulating layer opposite the first inorganic insulating layer and directly and electrically connecting a part of the third vertical interconnection to a part of the fourth vertical interconnection.

11. The semiconductor device as claimed in claim 9, further comprising:
a resin layer provided on the one face of the first substrate, the resin layer coating lateral faces of the semiconductor chip stack and the semiconductor chip.

12. The semiconductor device as claimed in claim 9,
wherein the one face of the first substrate includes a recess, and
wherein the semiconductor chip stack and the semiconductor chip are attached in the recess while facing the electrode pad forming side of each of the semiconductor chip stack and the semiconductor chip to a bottom side of the recess.

13. The semiconductor device as claimed in claim 9, wherein the semiconductor chip is formed as a second semiconductor chip stack.

* * * * *